(12) United States Patent
Hopkins et al.

(10) Patent No.: US 12,041,769 B2
(45) Date of Patent: Jul. 16, 2024

(54) METHODS OF FORMING MICROELECTRONIC DEVICES

(71) Applicant: Micron Technology, Inc., Boise, ID (US)

(72) Inventors: John D. Hopkins, Meridian, ID (US); Jordan D. Greenlee, Boise, ID (US); Nancy M. Lomeli, Boise, ID (US)

(*) Notice: Subject to any disclaimer, the term of this patent is extended or adjusted under 35 U.S.C. 154(b) by 0 days.

(21) Appl. No.: 18/047,245

(22) Filed: Oct. 17, 2022

(65) Prior Publication Data
US 2023/0061327 A1    Mar. 2, 2023

Related U.S. Application Data

(62) Division of application No. 17/012,741, filed on Sep. 4, 2020, now Pat. No. 11,515,320.

(51) Int. Cl.
| | |
|---|---|
| *H10B 43/50* | (2023.01) |
| *G11C 5/02* | (2006.01) |
| *G11C 5/06* | (2006.01) |
| *H01L 23/538* | (2006.01) |
| *H10B 41/27* | (2023.01) |
| *H10B 43/27* | (2023.01) |

(52) U.S. Cl.
CPC ............ *H10B 41/27* (2023.02); *G11C 5/025* (2013.01); *G11C 5/06* (2013.01); *H01L 23/5386* (2013.01); *H10B 43/27* (2023.02); *H10B 43/50* (2023.02)

(58) Field of Classification Search
None
See application file for complete search history.

(56) References Cited

U.S. PATENT DOCUMENTS

| | | |
|---|---|---|
| 2016/0163732 A1 | 6/2016 | Lim et al. |
| 2021/0217764 A1 | 7/2021 | Kim et al. |

*Primary Examiner* — Sarah K Salerno
(74) *Attorney, Agent, or Firm* — TraskBritt

(57) ABSTRACT

A method of forming a microelectronic device comprises forming a sacrificial material over a base structure. Portions of the sacrificial material are replaced with an etch-resistant material. A stack structure is formed over the etch-resistant material and remaining portions of the sacrificial material. The stack structure comprises a vertically alternating sequence of insulative material and additional sacrificial material arranged in tiers, and at least one staircase structure horizontally overlapping the etch-resistant material and having steps comprising horizontal ends of the tiers. Slots are formed to vertically extend through the stack structure and the remaining portions of the sacrificial material. The sacrificial material and the additional sacrificial material are selectively replaced with conductive material after forming the slots to respectively form lateral contact structures and conductive structures. Microelectronic devices, memory devices, and electronic systems are also described.

20 Claims, 12 Drawing Sheets

METHODS OF FORMING MICROELECTRONIC DEVICES

CROSS-REFERENCE TO RELATED APPLICATION

This application is a divisional of U.S. patent application Ser. No. 17/012,741, filed Sep. 4, 2020, the disclosure of which is hereby incorporated herein in its entirety by this reference.

TECHNICAL FIELD

The disclosure, in various embodiments, relates generally to the field of microelectronic device design and fabrication. More specifically, the disclosure relates to methods of forming microelectronic devices, and to related microelectronic devices, memory devices, and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes memory strings vertically extending through one or more stack structures individually including tiers of conductive structures and insulative structures. Each memory string may include at least one select device coupled in series to a serial combination of vertically stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure of the memory device and conductive routing structures so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure of the memory device. Such staircase structures include individual "steps" defining contact regions of the conductive structures, upon which conductive contact structures can be positioned to provide electrical access to the conductive structures.

Unfortunately, as feature packing densities have increased and margins for formation errors have decreased, conventional methods of forming memory devices (e.g., 3D NAND Flash memory devices) have resulted in undesirable damage that can diminish desired memory device performance, reliability, and durability. For example, conventional methods of forming the stack structure of a memory device (e.g., 3D NAND Flash memory device) using so called "replacement gate" or "gate last" processing, wherein sacrificial structures of a preliminary stack structure are at least partially replaced with the conductive structures, can result in undesirable deformations (e.g., tier bending, tier warping, tier bowing) and/or undesirable damage (e.g., tier cracking, tier collapse) proximate the staircase structures within the preliminary stack structure. Such deformations and/or damage can result in undesirable defects, undesirable reliability, and/or undesirable durability in the memory device including the stack structure formed through such conventional methods.

DETAILED DESCRIPTION

Figure 1A:
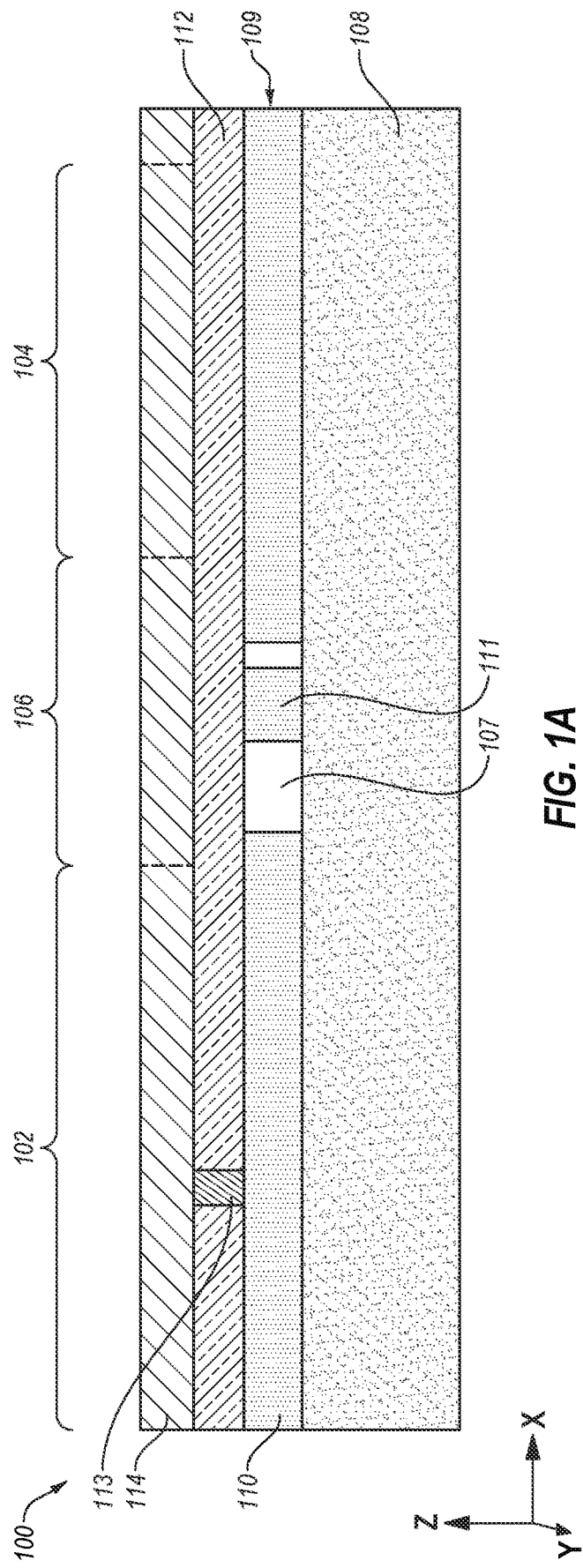
FIG. 1A through FIG. 5B are simplified partial cross-sectional (FIGS. 1A, 2A, 3A, 4A, and 5A) and simplified partial top-down (FIGS. 1B, 2B, 3B, 4B, and 5B) views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$)), a zirconium oxide (ZrO$_x$), a tantalum oxide (TaO$_x$), and a magnesium oxide (MgO$_x$)), at least one dielectric nitride material (e.g., a silicon nitride (SiN$_y$)), at least one dielectric oxynitride material (e.g., a silicon oxynitride (SiO$_x$N$_y$)), at least one dielectric oxycarbide material (e.g., silicon oxycarbide (SiO$_x$C$_y$)), at least one hydrogenated dielectric oxycarbide material (e.g., hydrogenated silicon oxycarbide (SiC$_x$O$_y$H$_z$)), and at least one dielectric carboxynitride material (e.g., a silicon carboxynitride (SiO$_x$C$_z$N$_y$)). Formulae including one or more of "x," "y," and "z" herein (e.g., SiO$_x$, AlO$_x$, HfO$_x$, NbO$_x$, TiO$_x$, SiN$_y$, SiO$_x$N$_y$, SiO$_x$C$_y$, SiC$_x$O$_y$H$_z$, SiO$_x$C$_z$N$_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1A through FIG. 5B are simplified partial cross-sectional (FIGS. 1A, 2A, 3A, 4A, and 5A) and simplified partial top-down (FIGS. 1B, 2B, 3B, 4B, and 5B) views illustrating embodiments of a method of forming a microelectronic device structure (e.g., a memory structure) for a microelectronic device (e.g., a memory device, such as a 3D NAND Flash memory device). With the description provided below, it will be readily apparent to one of ordinary skill in the art that the methods described herein may be used for forming various devices. In other words, the methods of the disclosure may be used whenever it is desired to form a microelectronic device.

Figure 1B:
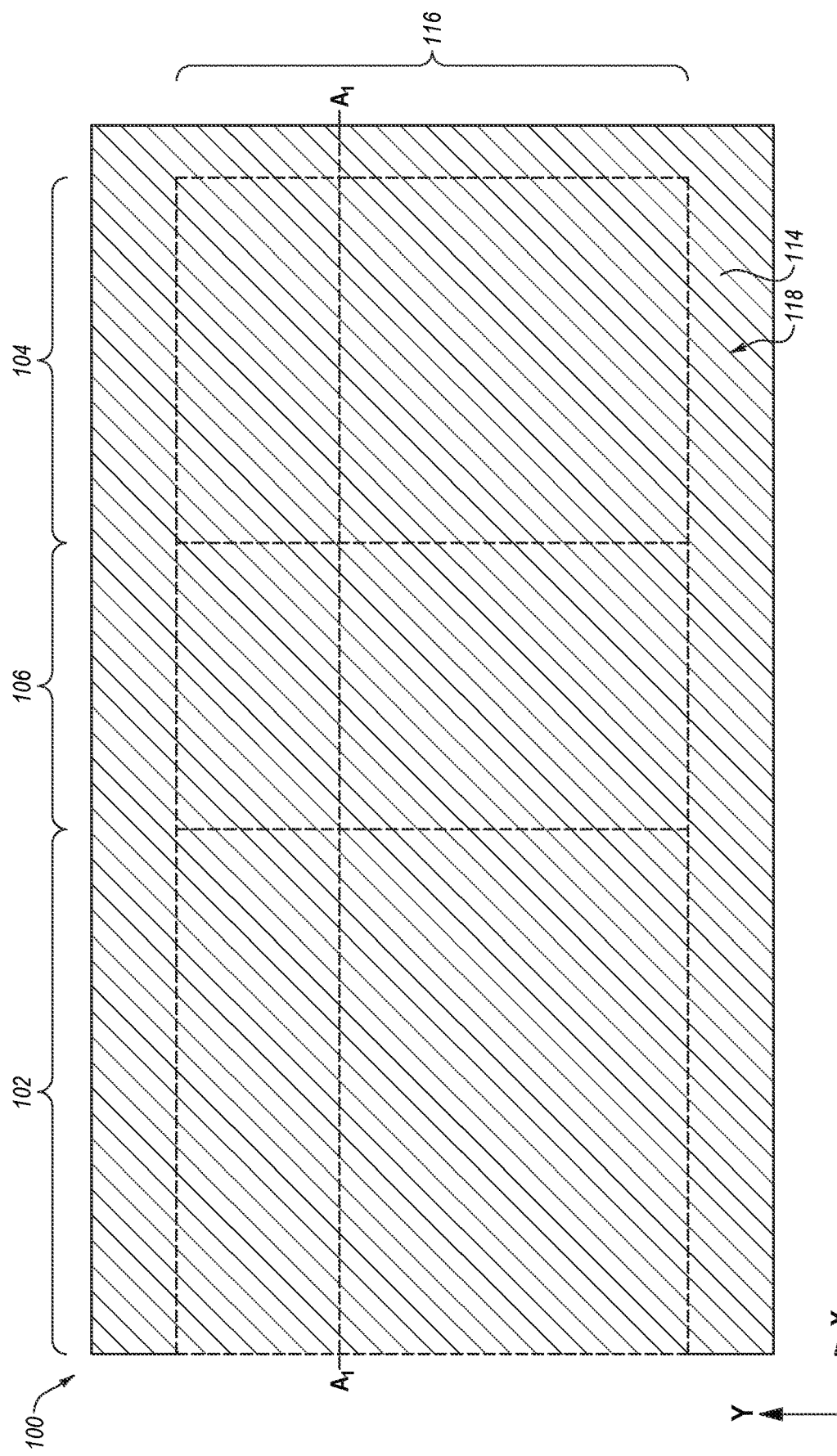

Referring collectively to FIG. 1A and FIG. 1B (which depicts a simplified partial top-down view of the microelectronic device structure 100 at the processing stage shown in FIG. 1A), a microelectronic device structure 100 may be formed to include a base structure 108, a source tier 109 over the base structure 108, an isolation material 112 over the source tier 109, and a sacrificial material 114 over the isolation material 112. The foregoing features, as well as additional features (e.g., additional materials, additional structures, additional devices), of the microelectronic device structure 100 at the processing stage depicted in FIG. 1A and FIG. 1B, are described in further detail below. The view depicted in FIG. 1A is a simplified partial cross-sectional view of the microelectronic device structure 100 about the dashed line A$_1$-A$_1$ illustrated in FIG. 1B.

As shown in FIG. 1A and FIG. 1B, the microelectronic device structure 100 may be divided into multiple regions in a first horizontal direction (e.g., the X-direction). For example, in the X-direction depicted in FIG. 1A and FIG. 1B, the microelectronic device structure 100 may include at least one memory array region 102, at least one staircase region 104 (e.g., at least one access line contact region), and at least one intervening region 106 horizontally interposed (e.g., in the X-direction) between the memory array region 102 and the staircase region 104. Additional features (e.g., additional structures, additional materials, additional devices) facilitating desirable functions and characteristic of the microelectronic device structure may subsequently be formed in the different horizontal regions (e.g., the memory array region 102, the staircase region 104, and the intervening region 106) of the microelectronic device structures 100, as described in further detail below.

As shown in FIG. 1B, the microelectronic device structure 100 may be further divided into additional regions in a second horizontal direction (e.g., the Y-direction) orthogonal to the first horizontal direction (e.g., the X-direction). For example, in the Y-direction depicted in FIG. 1B, the microelectronic device structure 100 may include block regions 116, and slot regions 118 horizontally surrounding (e.g., in the Y-direction and in the X-direction) the block regions 116. The slot regions 118 may be horizontally interposed between horizontally neighboring block regions 116. The block regions 116 and the slot regions 118 may define areas for block structures and slots (e.g., slits, trenches) to be formed during subsequent processing of the microelectronic device structure 100 to form a microelectronic device, as described in further detail below.

In FIG. 1A and FIG. 1B, interfaces between horizontally boundaries of different horizontal regions (e.g., the memory array region 102, the staircase region 104, the intervening region 106, the block regions 116) of the microelectronic device structure 100 are depicted by way of dashed lines. For clarity and ease of understanding the description, in FIG. 1A the dashed lines associated with the interfaces between the horizontally boundaries of the memory array region 102, the staircase region 104, and the intervening region 106 only extend into the sacrificial material 114. However, it will be understood that the different horizontal regions of the microelectronic device structure 100 are not limited to the sacrificial material 114 alone. Additional features (e.g., additional structures, additional materials, additional devices) may subsequently be formed within the different horizontal regions of the microelectronic device structure 100, as described in further detail below. Some of the additional features may be formed to be substantially confined with one or more of the different horizontal regions of the microelectronic device structure 100, such that these additional features are formed to be located in at least one but less than all of the different horizontal regions of the microelectronic device structure 100. Some other of the additional features may be formed to be located in each of the different horizontal regions of the microelectronic device structure 100, such that portions of these other additional features are located in all of the different horizontal regions of the microelectronic device structure 100.

The base structure 108 comprises a construction upon which additional features (e.g., materials, structures, devices) of the microelectronic device structure 100 are formed. The base structure 108 may include a semiconductive structure (e.g., a semiconductive wafer), and/or a semiconductive material on or over another structure (e.g., a supporting structure). Semiconductive material of the base structure 108 may, for example, include one or more of silicon, such monocrystalline silicon and/or polycrystalline silicon (also referred to herein as "polysilicon"); silicon-germanium; germanium; gallium arsenide; a gallium nitride; gallium phosphide; indium phosphide; indium gallium nitride; and aluminum gallium nitride. The base structure 108 may further include one or more additional materials (e.g., conductive materials, insulative materials), structures (e.g., conductive structures, insulative structure), devices (e.g., control logic devices), and/or regions therein. For example, the base structure 108 may include a control logic region therein including various transistors and conductive routing structures (e.g., conductive line structures, conductive contact structures) that together form control logic circuitry for various control logic devices of the microelectronic device structure 100. In some embodiments, the control logic devices within the base structure 108 comprise complementary metal oxide semiconductor (CMOS) circuitry.

The control logic devices within the control logic region of the base structure 108 may be configured to control various operations of additional features (e.g., arrays of memory cells) to subsequently be formed within the memory array region 102 of the microelectronic device structure 100, as described in further detail below. As a non-limiting example, the control logic devices may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, string drivers, page buffers, and various chip/deck control circuitry. As another non-limiting example, the control logic devices may include devices configured to control column operations for arrays (e.g., memory cell arrays) to be formed within the memory array region 102 of the microelectronic device structure 100, such as one or more (e.g., each) of decoders (e.g., local deck decoders, column decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry), I/O devices (e.g., local I/O devices), memory test devices, array multiplexers (MUX), and error checking and correction (ECC) devices. As a further non-limiting example, the control logic devices may include devices configured to control row operations for arrays (e.g., memory cell arrays) to be formed within the memory array region 102 of the microelectronic device structure 100, such as one or more (e.g., each) of decoders (e.g., local deck decoders, row decoders), drivers (e.g., access line drivers, word line (WL) drivers), repair circuitry (e.g., row repair circuitry), memory test devices, MUX, ECC devices, and self-refresh/wear leveling devices.

The source tier 109 may be vertically interposed (e.g., in the Z-direction) between the base structure 108 and the sacrificial material 114 overlying the base structure 108. The source tier 109 may include at least one source structure 110. The source tier 109 may also include one or more contact structures 111 (e.g., contact pads) horizontally neighboring and electrically isolated from the source structure 110. As shown in FIG. 1A, at least one dielectric material 107 may be interposed between the source structure 110 and the contact structures 111.

The source structure 110 and the contact structures 111 of the source tier 109 may each be formed of and include conductive material. A material composition of the source structure 110 may be substantially the same as a material composition of the contact structures 111. In some embodiments, the source structure 110 and the contact structures 111 are formed of and include conductively doped semiconductive material, such as a conductively doped form of one or more of a silicon material, such as monocrystalline silicon or polycrystalline silicon; a silicon-germanium material; a germanium material; a gallium arsenide material; a gallium nitride material; and an indium phosphide material. As a non-limiting example, the source structure 110 and the contact structures 111 may be formed of and include silicon (e.g., polycrystalline silicon) doped with at least one dopant (e.g., one or more of at least one n-type dopant, at least one p-type dopant, and at least one other dopant). In additional embodiments, the source structure 110 and the contact structures 111 are formed of and include one or more of a metal, an alloy, and a conductive metal-containing material (e.g., a conductive metal nitride, a conductive metal silicide, a conductive metal carbide, a conductive metal oxide). As a non-limiting example, the source structure 110 and the contact structures 111 may be formed of and include W.

The isolation material 112 overlying the source tier 109 may be formed of and include insulative material. By way of non-limiting example, the isolation material 112 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). A material composition of the isolation material 112 may be substantially the same as a material composition of the dielectric material 107, or a material composition of the isolation material 112 may be different than a material composition of the dielectric material 107. In some embodiments, the isolation material 112 is formed of and includes at least one dielectric oxide material (e.g., $SiO_x$, such as silicon dioxide ($SiO_2$)). The isolation material 112 may be substantially homogeneous, or the isolation material 112 may be heterogeneous.

Referring to FIG. 1A, vertical contact structures 113 may be formed to vertically extend through the isolation material 112. The vertical contact structures 113 may, for example, be formed to vertically extend (e.g., in the Z-direction) from the sacrificial material 114 overlying the isolation material 112, through the isolation material 112, and to the source tier 109. At least some of the vertical contact structures 113 contact (e.g., physically contact, electrically contact) the source structure 110 of the source tier 109. The vertical contact structures 113 may couple the source structure 110 to additional structures (e.g., lateral contact structures) to subsequently be formed using the sacrificial material 114, as described in further detail below. The vertical contact structures 113 may each be formed of and include conductive material. By way of non-limiting example, the vertical contact structures 113 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the vertical contact structures 113 are formed of and include W.

The sacrificial material 114 may be formed of and include at least one material that may be selectively removed relative to the isolation material 112 and insulative structures of a stack structure to be formed on or over the sacrificial material 114 (as described in further detail below). A material composition of the sacrificial material 114 is different than a material composition of the isolation material 112 and the insulative structures to be formed. The sacrificial material 114 may be selectively etchable relative to the isolation material 112 and the insulative structures to be formed during common (e.g., collective, mutual) exposure to a first etchant; and the isolation material 112 and the insulative structures may be selectively etchable relative to the sacrificial material 114 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater.

As a non-limiting example, the sacrificial material 114 may be formed of and include a semiconductive material, such as one or more of silicon (e.g., monocrystalline silicon and/or polycrystalline silicon), silicon-germanium, germanium, gallium arsenide, a gallium nitride, gallium phosphide, indium phosphide, indium gallium nitride, and aluminum gallium nitride. In some embodiments, the sacrificial material 114 is formed of and includes polycrystalline silicon.

As another non-limiting example, the sacrificial material 114 may be formed of and include a different insulative material than the isolation material 112 and insulative structures to subsequently be formed, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), and at least one dielectric carboxynitride material (e.g., $SiO_xC_zN_y$). In some embodiments, such as embodiments wherein the isolation material 112 and insulative structures to subsequently be formed comprise a dielectric oxide material (e.g., $SiO_x$, such as $SiO_2$), the sacrificial material 114 is formed of and includes at least one dielectric nitride material (e.g., $SiN_y$, such as $Si_3N_4$).

Figure 2A:
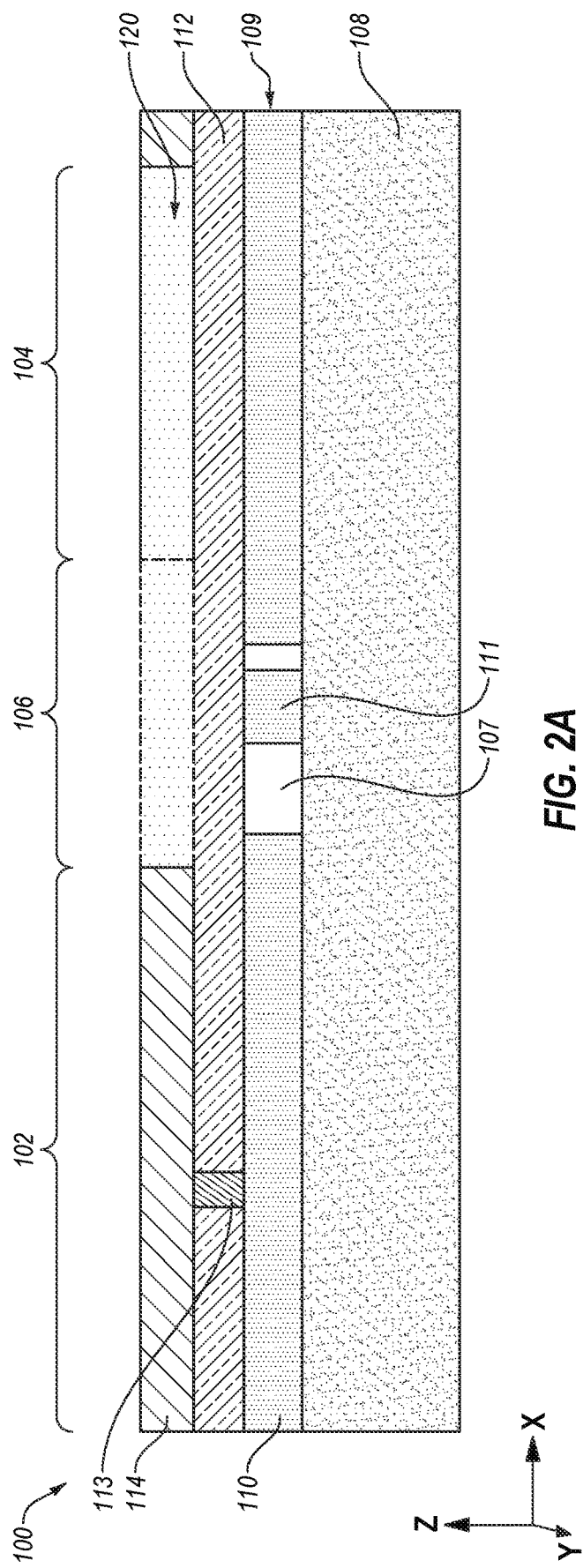
Figure 2B:
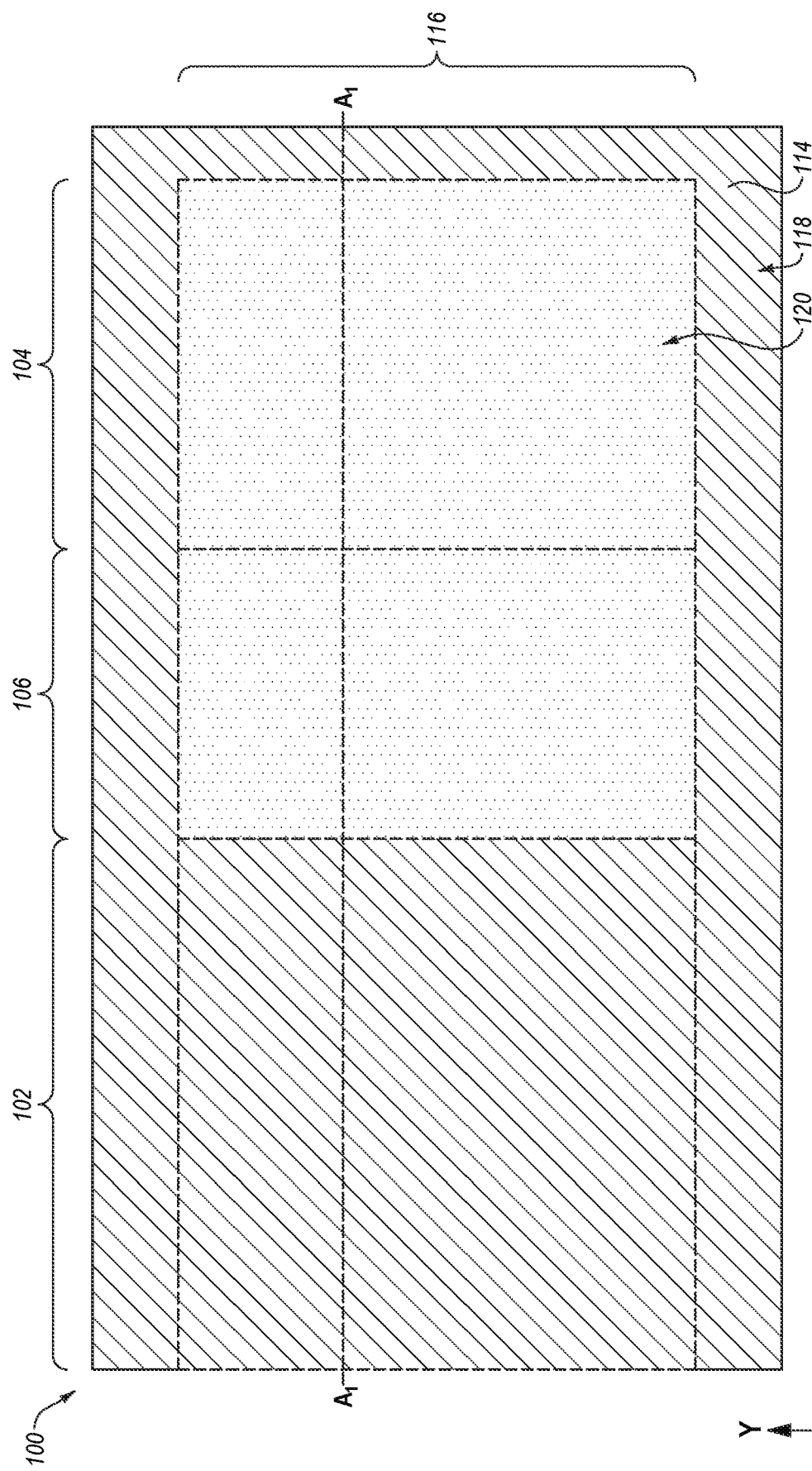

Next, referring collectively to FIG. 2A and FIG. 2B (which depicts a simplified partial top-down view of the microelectronic device structure 100 at the processing stage shown in FIG. 2A), an etch-resistant material 120 may be formed within the sacrificial material 114. The etch-resistant material 120 may be relatively more resistant to removal than the sacrificial material 114 during common (e.g., collective, mutual) exposure to an etchant (e.g., an etching agent, such as a wet etching agent). The sacrificial material 114 may be selectively etchable relative to the etch-resistant material 120 during common exposure to the etchant. The view depicted in FIG. 2A is a simplified partial cross-sectional view of the microelectronic device structure 100 about the dashed line $A_1$-$A_1$ illustrated in FIG. 2B.

The etch-resistant material 120 may at least be formed within horizontal areas previously occupied by the sacrificial material 114 that correspond to intersecting portions (e.g., horizontally overlapping portions) of the staircase region 104 of the microelectronic device structure 100 and the block regions 116 of the microelectronic device structure 100. Optionally, the etch-resistant material 120 may also be formed within additional horizontal areas previously occupied by the sacrificial material 114 that correspond to intersecting portions of the staircase region 104 of the microelectronic device structure 100 and the slot regions 118 of the microelectronic device structure 100. In addition, optionally, the etch-resistant material 120 may also be formed within additional horizontal areas previously occupied by the sacrificial material 114 that correspond to intersecting portions of the intervening region 106 of the microelectronic device structure 100 and at least the block regions 116 (and, optionally, the slot regions 118) of the microelectronic device structure 100. The etch-resistant material 120 may be omitted from (e.g., not formed within) horizontal areas of the sacrificial material 114 corresponding to intersecting portions of the memory array region 102 of the microelectronic device structure 100 and the block regions 116 of the microelectronic device structure 100. In some embodiments, the etch-resistant material 120 is substantially confined within horizontal areas previously occupied by intersecting portions of the staircase region 104 and the block regions 116 of the microelectronic device structure 100. In additional embodiments, the etch-resistant material 120 is substantially confined within horizontal areas previously occupied by intersecting portions of the staircase region 104 and the block regions 116 of the microelectronic device structure 100, and intersecting portions of the intervening region 106 and the block regions 116 of the microelectronic device structure 100.

Still collectively referring to FIG. 2A and FIG. 2B, in some embodiments, the etch-resistant material 120 is formed by removing (e.g., etching) portions of the sacrificial material 114 to form one or more opening(s) (e.g., aperture (s), trenches(s)) within the sacrificial material 114, and then filling the openings with the etch-resistant material 120. The opening(s) may be formed to vertically extend substantially through the sacrificial material 114. For example, the opening(s) may vertically extend to and expose (e.g., uncover) portions of the isolation material 112 underlying the sacrificial material. The etch-resistant material 120 may be formed (e.g., deposited) to substantially fill the opening(s) formed in the sacrificial material 114. An upper vertical boundary (e.g., an upper surface) of the etch-resistant material 120 may be formed to be substantially coplanar with an upper vertical boundary (e.g., an upper surface) of a remaining (e.g., unremoved) portion of the sacrificial material 114.

If portions of the sacrificial material 114 are removed to form openings that are then filled with the etch-resistant material 120, the etch-resistant material 120 may comprise one or more of an insulative material, a conductive material, and a semiconductive material having relatively greater etch resistance than the sacrificial material 114 during common (e.g., collective, mutual) exposure to at least one etchant (e.g., phosphoric acid ($H_3PO_4$), tetramethylammonium hydroxide (TMAH), another etchant) employed in subsequent processing of the microelectronic device structure 100. As a non-limiting example, the etch-resistant material 120 may be formed of and include at least one dielectric material, such as one or more of at least one dielectric oxide material, at least one dielectric nitride material, at least one dielectric oxynitride material, at least one dielectric oxycarbide material, at least one hydrogenated dielectric oxycarbide material, and at least one dielectric carboxynitride material. In some embodiments, the etch-resistant material 120 is formed of and includes at least one dielectric oxide material, such as $SiO_x$ (e.g., $SiO_2$). In additional embodiments, the etch-resistant material 120 is formed of and includes at least one dielectric nitride material (e.g., $SiN_y$, such as $Si_3N_4$) doped with one or more of carbon and oxygen. As another non-limiting example, the etch-resistant material 120 may be formed of and include at least one conductive material, such as one or more of at least one metal, at least one alloy, at least one conductive metal-containing material (e.g., at least one conductive metal nitride, at least one conductive metal silicide, at least one conductive metal carbide, at least one conductive metal oxide), and at least one conductively doped semiconductor material (e.g., conductively doped polysilicon, conductively doped Ge, conductively doped silicon SiGe). In some embodiments, the etch-resistant material 120 is formed of and includes one or more of at least one metal (e.g., one or more of W, Co, and Mo), at least one conductive metal nitride (e.g., one or more of $WN_x$ and $TiN_x$), at least one conductive metal silicide (e.g., one or more of $WSi_x$ and $CoSi_x$), and at least one conductive metal oxide. In additional embodiments, the etch-resistant material 120 is formed of and includes polysilicon doped with one or more of at least one P-type dopant (e.g., one or more of boron (B), aluminum (Al), and gallium (Ga)), carbon, nitrogen, and oxygen. The sacrificial material 114 may be substantially homogeneous, or the sacrificial material 114 may be heterogeneous.

In additional embodiments, the etch-resistant material 120 is formed by doping portions of the sacrificial material 114 with at least one dopant (e.g., chemical species) that modify the etch resistance of the doped portions of the sacrificial material 114 relative to other portions of the sacrificial material 114. The doped portions of the sacrificial material 114 may constitute the etch-resistant material 120. The dopant may be selected at least partially based on the material composition of the sacrificial material 114, so as to enhance the etch resistance of the doped portions of sacrificial material 114 forming the etch-resistant material 120 during exposure to at least one etchant relative to other portions of the sacrificial material 114 remaining undoped with the dopant. As a non-limiting example, if the sacrificial material 114 comprises polysilicon, the portions of the sacrificial material 114 may be doped with one or more of at least one P-type dopant (e.g., one or more of B, Al, and Ga), carbon, nitrogen, and oxygen to form the etch-resistant material 120. The etch-resistant material 120 (e.g., doped polysilicon) may, for example, have greater etch resistance to TMAH than remaining portions of the sacrificial material 114 not doped with the one or more of at least one P-type dopant, carbon, nitrogen, and oxygen. As another non-limiting example, if the sacrificial material 114 comprises a dielectric nitride material (e.g., $SiN_y$, such as $Si_3N_4$), the portions of the sacrificial material 114 may be doped with one or more of carbon and oxygen to form the etch-resistant material 120. The etch-resistant material 120 (e.g., doped dielectric nitride material) may, for example, have greater etch resistance to $H_3PO_4$ than remaining portions of the sacrificial material 114 not doped with the one or more of carbon and oxygen.

If the sacrificial material 114 is doped to form the etch-resistant material 120, a concentration range of dopant within the etch-resistant material 120 may at least partially depend on material compositions of the sacrificial material 114 and the dopant. As a non-limiting example, if the sacrificial material 114 comprises polysilicon and the dopant comprises at least one P-type dopant, a concentration range of the P-type dopant within the etch-resistant material 120 (e.g., doped polysilicon) may be greater than or equal to about 1E17 units (e.g., atoms, ions) of P-type dopant per cubic centimeter ($cm^3$), such as greater than or equal to 1E17 units of P-type dopant/$cm^3$, from about 1E18 units of P-type dopant/$cm^3$ to about 5E18 units of P-type dopant/$cm^3$. As another non-limiting example, if the sacrificial material 114 comprises polysilicon or dielectric nitride material (e.g., $SiN_y$, such as $Si_3N_4$) and the dopant comprises oxygen, the etch-resistant material 120 (e.g., doped polysilicon or doped dielectric nitride material) may comprise greater than or equal to 1 atomic percent oxygen, such as from about 1 atomic percent oxygen to about 66 atomic percent oxygen. As a further non-limiting example, if the sacrificial material 114 comprises polysilicon or dielectric nitride material (e.g., $SiN_y$, such as $Si_3N_4$) and the dopant comprises carbon, the etch-resistant material 120 (e.g., doped polysilicon or doped dielectric nitride material) may comprise greater than or equal to 1 atomic percent carbon, such as from about 1 atomic percent carbon to about 20 atomic percent carbon.

Figure 3A:
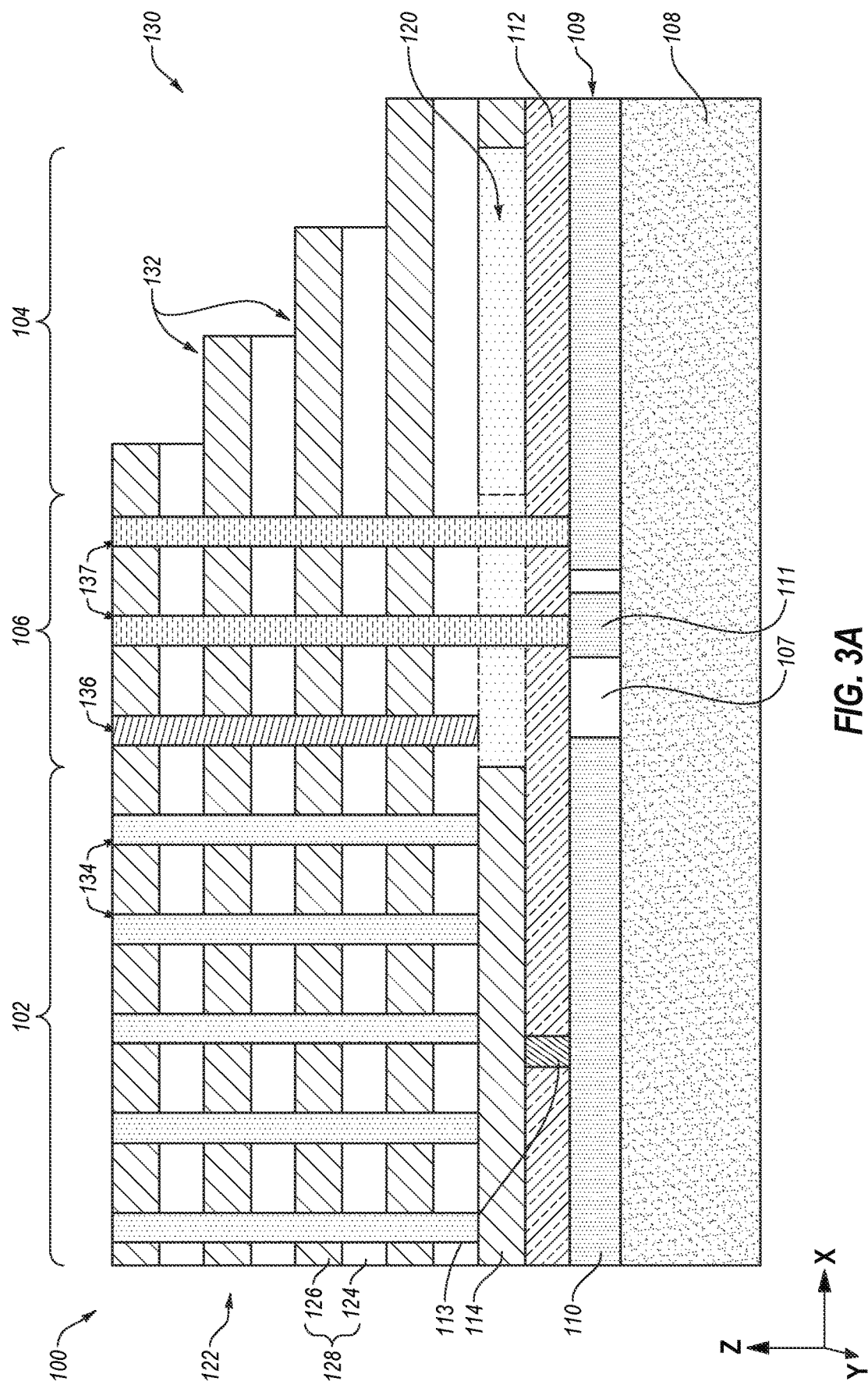
Figure 3B:
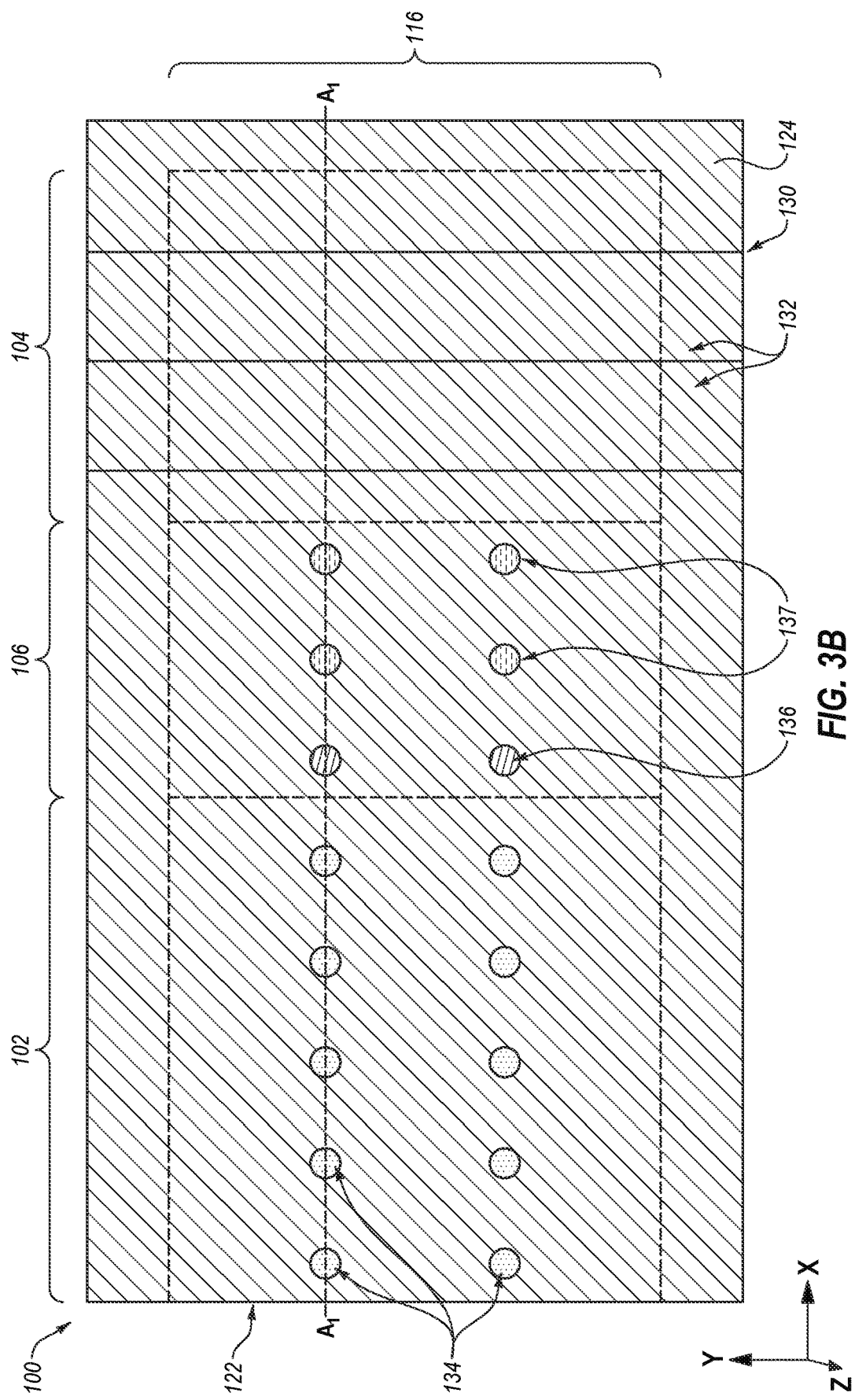

Next, referring collectively to FIG. 3A and FIG. 3B (which depicts a simplified partial top-down view of the microelectronic device structure 100 at the processing stage shown in FIG. 3A), a preliminary stack structure 122 including at least one staircase structure 130 therein may be formed on or over the etch-resistant material 120 and remaining portions of the sacrificial material 114. The preliminary stack structure 122 may horizontally extend (e.g., in the X-direction and the Y-direction) throughout the memory array region 102, the staircase region 104, and the intervening region 106 of the microelectronic device structure 100. The staircase structure 130 may be formed within the staircase region 104 of the microelectronic device structure 100. In addition, further features may be formed within portions of the memory array region 102 and the intervening region 106 horizontally overlapping with the block regions 116 of the microelectronic device structure 100. Non-limiting examples of such further features include cell pillar structures 134, dummy pillar structures 136, and deep contact pillar structures 137. The foregoing features, as well as other features of the microelectronic device structure 100 at the processing stage of FIG. 3A and FIG. 3B, are described in further detail below. The view depicted in FIG. 3A is a simplified partial cross-sectional view of the microelectronic device structure 100 about the dashed line $A_1$-$A_1$ illustrated in FIG. 3B.

The preliminary stack structure 122 may be formed to include a vertically alternating (e.g., in the Z-direction) sequence of insulative material 124 and additional sacrificial material 126 arranged in tiers 128. Each of the tiers 128 of the preliminary stack structure 122 may include the additional sacrificial material 126 vertically neighboring the insulative material 124. The preliminary stack structure 122 may be formed to include any desired number of the tiers 128, such as greater than or equal to sixteen (16) of the tiers 128, greater than or equal to thirty-two (32) of the tiers 128, greater than or equal to sixty-four (64) of the tiers 128, greater than or equal to one hundred and twenty-eight (128) of the tiers 128, or greater than or equal to two hundred and fifty-six (256) of the tiers 128.

The insulative material 124 of the tiers 128 of the preliminary stack structure 122 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). A material composition of the insulative material 124 may be different than material composition(s) of the additional sacrificial material 126 and the sacrificial material 114. The material composition of the insulative material 124 may be substantially the same as a material composition of the etch-resistant material 120, or the material composition of the insulative material 124 may be different than the material composition of the etch-resistant material 120. In some embodiments, each of the insulative material 124 is formed of and includes a dielectric oxide material, such as $SiO_x$ (e.g., $SiO_2$). The insulative material 124 of each of the tiers 128 may be substantially homogeneous, or the insulative material 124 of one or more (e.g., each) of the tiers 128 may be heterogeneous.

The additional sacrificial material 126 of the tiers 128 of the preliminary stack structure 122 may be formed of and include at least one material (e.g., at least one insulative material) that may be selectively removed relative to the insulative material 124, the etch-resistant material 120, and the isolation material 112. A material composition of the additional sacrificial material 126 is different than material compositions of the insulative material 124, the etch-resistant material 120, and the isolation material 112. The material composition of the additional sacrificial material 126 may be substantially the same as a material composition of the sacrificial material 114, or the material composition of the insulative material 124 may be different than the material composition of the sacrificial material 114. The additional sacrificial material 126 may be selectively etchable relative to the insulative material 124, the etch-resistant material 120, and the isolation material 112 during common (e.g., collective, mutual) exposure to a first etchant; and the insulative material 124, the etch-resistant material 120, and the isolation material 112 may be selectively etchable relative to the additional sacrificial material 126 during common exposure to a second, different etchant. In some embodiments, each of the additional sacrificial material 126 is formed of and includes a dielectric nitride material, such as $SiN_y$ (e.g., $Si_3N_4$). In some of such embodiments, the sacrificial material 114 is formed of and includes the same dielectric nitride material (e.g., $SiN_y$, such as $Si_3N_4$) as the additional sacrificial material 126. The additional sacrificial material 126 and the sacrificial material 114 may, for example, be selectively etchable relative to the insulative material 124, the etch-resistant material 120, and the isolation material 112 during common exposure to a wet etchant comprising $H_3PO_4$. In additional embodiments, each of the additional sacrificial material 126 is formed of and includes polycrystalline silicon. In some of such embodiments, the sacrificial material 114 is also formed of and includes the polycrystalline silicon. The additional sacrificial material 126 and the sacrificial material 114 may, for example, be selectively etchable relative to the insulative material 124, the etch-resistant material 120, and the isolation material 112 during common exposure to a wet etchant comprising TMAH. The additional sacrificial material 126 may be substantially homogeneous, or the additional sacrificial material 126 may be heterogeneous.

The at least one staircase structure 130 may be formed and positioned within portions of the preliminary stack structure 122 within horizontal boundaries (e.g., in the X-direction) of the staircase region 104 of the microelectronic device structure 100. The staircase structure 130 may be formed to horizontally extend (e.g., in the Y-direction) across the block regions 116 and the slot regions 118 of the microelectronic device structure 100. The staircase structure 130 includes steps 132 at least partially defined by horizontal ends (e.g., in the X-direction) of the tiers 128 of the preliminary stack structure 122. The steps 132 of the staircase structure 130 may be employed as contact regions to electrically connect the conductive structures subsequently formed using the additional sacrificial material 126 (e.g., through so-called "replacement gate" or "gate last" processing) to other features (e.g., control logic devices within the base structure 108) of the microelectronic device structure 100, as described in further detail below. A quantity of steps 132 included in the staircase structure 130 may be substantially the same as (e.g., equal to) or may be different than (e.g., less than, greater than) the quantity of tiers 128 in the preliminary stack structure 122. As shown in FIG. 3A, in some embodiments, the steps 132 of the staircase structure 130 are arranged in order, such that steps 132 directly horizontally adjacent one another in the X-direction correspond to tiers 128 of the preliminary stack structure 122 directly vertically adjacent (e.g., in the Z-direction) one another. In additional embodiments, the steps 132 of the staircase structure 130 are arranged out of order, such that at least some steps 132 of the staircase structure 130 directly horizontally adjacent one another in the X-direction correspond to tiers 128 of preliminary stack structure 122 not directly vertically adjacent (e.g., in the Z-direction) one another. The staircase structure 130 may vertically overlie (e.g., in the Z-direction) and horizontally overlap (e.g., in the X-direction and in the Y-direction) the etch-resistant material 120.

Figure 5A:
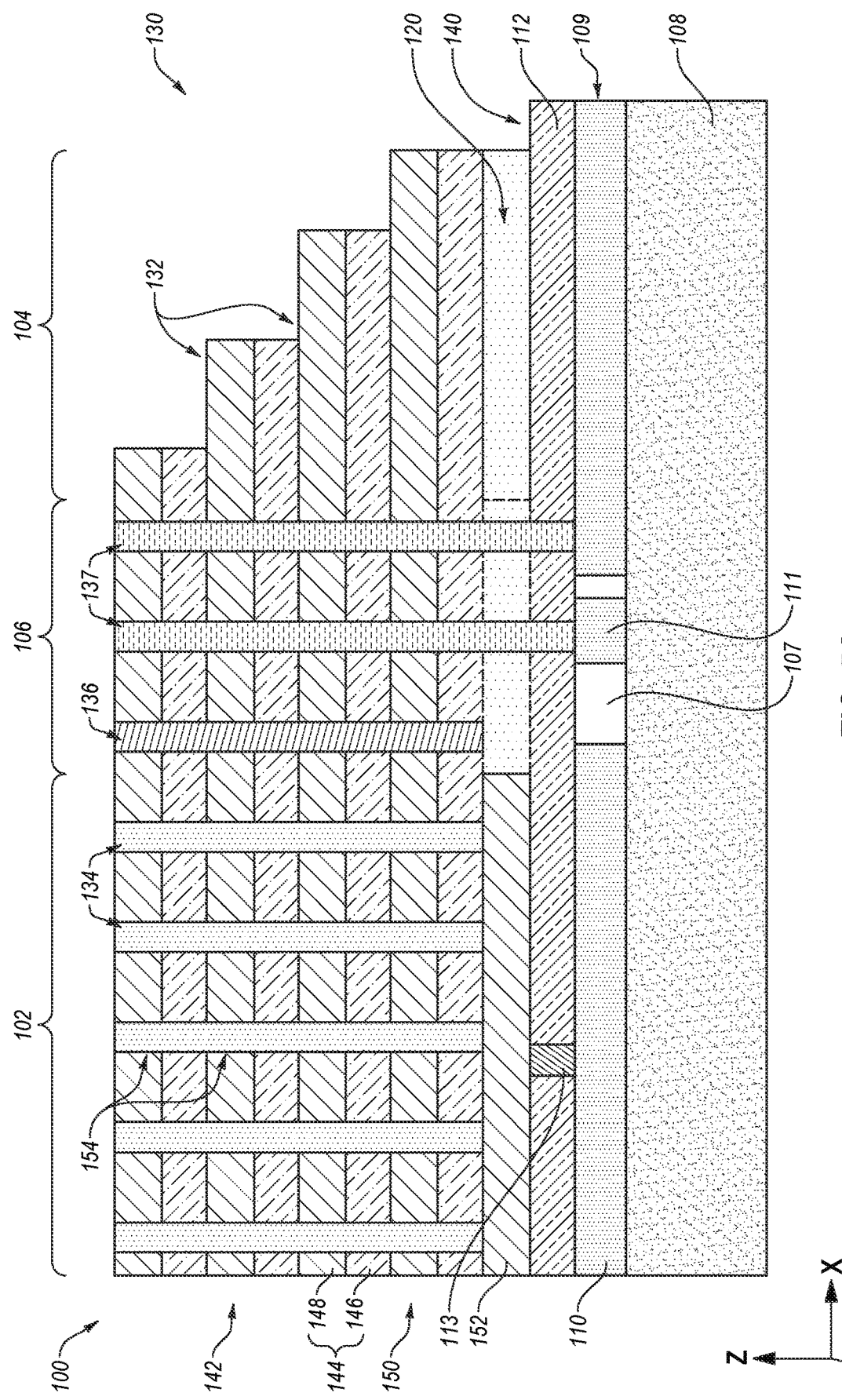

The cell pillar structures 134 may be formed and positioned within horizontal areas of the preliminary stack structure 122 corresponding to intersecting portions (e.g., horizontally overlapping portions) of the memory array region 102 and the block regions 116 of the microelectronic device structure 100. The cell pillar structures 134 may at least partially vertically overlie (e.g., in the Z-direction) and horizontally overlap (e.g., in the X-direction and in the Y-direction) remaining portions of the sacrificial material 114. As shown in FIG. 5A, in some embodiments, the cell pillar structures 134 vertically extend through the tiers 128 of the preliminary stack structure 122 and to the remaining portions of the sacrificial material 114. The cell pillar structures 134 may vertically terminate at or within the remaining portions of the sacrificial material 114. In additional embodiments, the cell pillar structures 134 vertically extend through the tiers 128 of the preliminary stack structure 122 and also vertically extend through the remaining portions of the sacrificial material 114. The cell pillar structures 134 may vertically terminate below the remaining portions of the sacrificial material 114, such as at or within the isolation material 112, at or within the source tier 109, or at or within the base structure 108.

The cell pillar structures 134 may each individually be formed of and include a stack of materials. By way of non-limiting example, each of the cell pillar structures 134 may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second oxide dielectric material (e.g., $SiO_x$, such as $SiO_2$); a channel material, such as a semiconductive material (e.g., silicon, such as polycrystalline Si); and a dielectric fill material (e.g., a dielectric oxide, a dielectric nitride, air). The charge-blocking material may be formed on or over surfaces of the insulative material 124 and the additional sacrificial material 126 of the tiers 128 of the preliminary stack structure 122 at least partially defining horizontal boundaries of the cell pillar structures 134; the charge-trapping material may be horizontally surrounded by the charge-blocking material; the tunnel dielectric material may be horizontally surrounded by the charge-blocking material; the channel material may horizontally surrounded by the tunnel dielectric material; and the dielectric fill material may horizontally surrounded by the channel material.

The dummy pillar structures 136, if any, may comprise pillar structures that are and/or that will be electrically disconnected from other features (e.g., conductive structures, such as conductive lines) of the microelectronic device structure 100; and/or that do not and/or will not facilitate electrical communication between the other features of the microelectronic device structure 100. The dummy pillar structures 136 may, for example, be employed to mitigate damage to and/or defects at edges of arrays of the cell pillar structures 134 (e.g., commonly referred to as "array edge effects").

If formed, the dummy pillar structures 136 may horizontally neighbor outermost (e.g., in the X-direction) cell pillar structures 134, such as cell pillar structures 134 positioned relatively closest to horizontal boundaries (e.g., in the X-direction) of the memory array region 102 of the microelectronic device structure 100. The dummy pillar structures 136 may be formed and positioned within horizontal areas of the preliminary stack structure 122 corresponding to intersecting portions (e.g., horizontally overlapping portions) of the intervening region 106 and the block regions 116 of the microelectronic device structure 100. The dummy pillar structures 136 may vertically extend through the tiers 128 of the preliminary stack structure 122 to remaining portions of the sacrificial material 114 and/or to the etch-resistant material 120. As shown in FIG. 5A, in some embodiments, the dummy pillar structures 136 vertically extend through the tiers 128 of the preliminary stack structure 122 and to the remaining portions of the sacrificial material 114 and/or to the etch-resistant material 120. The dummy pillar structures 136 may vertically terminate at or within the remaining portions of the sacrificial material 114 and/or at or within the etch-resistant material 120. In additional embodiments, the dummy pillar structures 136 vertically extend through the tiers 128 of the preliminary stack structure 122 and also vertically extend through the remaining portions of the sacrificial material 114 and/or etch-resistant material 120. The dummy pillar structures 136 may vertically terminate below the remaining portions of the sacrificial material 114 and the etch-resistant material 120, such as at or within the isolation material 112, at or within the source tier 109, or at or within the base structure 108.

The dummy pillar structures 136, if any, may be formed of and include one or more materials (e.g., insulative materials, conductive materials, semiconductive materials) able to alleviate undesirable array edge effects for arrays of the cell pillar structures 134 within subsequently formed blocks of a stack structure subsequently formed from the preliminary stack structure 122. In some embodiments, the dummy pillar structures 136 comprise dielectric pillar structures. In additional embodiments, the dummy pillar structures 136 comprise semiconductive pillar structures. In further embodiments, the dummy pillar structures 136 comprise conductive pillar structures. In yet further embodiments, the dummy pillar structures 136 comprise pillar structures substantially similar to the cell pillar structures 134, but that will not be electrically connected to one or more conductive structures (e.g., conductive lines, such as digit lines; lateral contact structures) that the cell pillar structures 134 will be electrically connected to. In such embodiments, the cell pillar structures 134 may be considered "active" cell pillar structures, and the dummy pillar structures 136 may be considered "inactive" cell pillar structures.

The deep contact pillar structures 137 may be formed and positioned within horizontal areas of the preliminary stack structure 122 corresponding to intersecting portions (e.g., horizontally overlapping portions) of the intervening region 106 and the block regions 116 of the microelectronic device structure 100. The deep contact pillar structures 137 may vertically extend through the tiers 128 of the preliminary stack structure 122, through remaining portions of the sacrificial material 114 and/or the etch-resistant material 120, through the isolation material 112, and to the source tier 109 of the microelectronic device structure 100. One or more of the deep contact pillar structures 137 may be configured and positioned to electrically connect one or more features of the source tier 109 (e.g., the source structure 110, the contact structures 111) to one or more conductive features (e.g., additional contact structures, conductive line structures) to subsequently be formed over upper vertical boundaries of the preliminary stack structure 122. Optionally, one or more other of the deep contact pillar structures 137 may be configured and positioned to serve as support structures for subsequent processing of the preliminary stack structure 122, such as subsequent replacement gate processing of the preliminary stack structure 122. The one or more other of the deep contact pillar structures 137 may, for example, be configured and positioned to provide support to the preliminary stack structure 122 at or proximate the staircase structure 130 to mitigate tier 128 collapse at or proximate the staircase structure 130 during the subsequent replacement gate processing. In some embodiments, the one or more other of the deep contact pillar structures 137 are positioned to electrically disconnected from the conductive features (e.g., additional contact structures, conductive line structures) to subsequently be formed over the upper vertical boundaries of the preliminary stack structure 122.

The deep contact pillar structures 137 may individually be formed of and include at least one conductive material, and at least one insulative liner material substantially horizontally surrounding and covering (e.g., across an entire vertical height of) the conductive material. In some embodiments, the conductive material of the deep contact pillar structures 137 comprises W. In additional embodiments, the conductive material of the deep contact pillar structures 137 comprises conductively doped polysilicon. The insulative liner material may be formed of and include at least one insulative material. In some embodiments, the insulative liner material of the deep contact pillar structures 137 comprises $SiO_x$ (e.g., $SiO_2$).

In embodiments wherein the etch-resistant material 120 is formed to horizontally extend into horizontal areas of the preliminary stack structure 122 corresponding to intersecting portions (e.g., horizontally overlapping portions) of the intervening region 106 and the block regions 116 of the microelectronic device structure 100, one or more (e.g., each) of the dummy pillar structures 136 and/or one or more (e.g., each) of the deep contact pillar structures 137 may be formed and provided within horizontal boundaries of the etch-resistant material 120. In additional embodiments wherein the etch-resistant material 120 is not formed to horizontally extend into horizontal areas of the preliminary stack structure 122 corresponding to intersecting portions (e.g., horizontally overlapping portions) of the intervening region 106 and the block regions 116 of the microelectronic device structure 100, the dummy pillar structures 136 and the deep contact pillar structures 137 may be formed and provided outside of horizontal boundaries of the etch-resistant material 120.

Figure 4A:
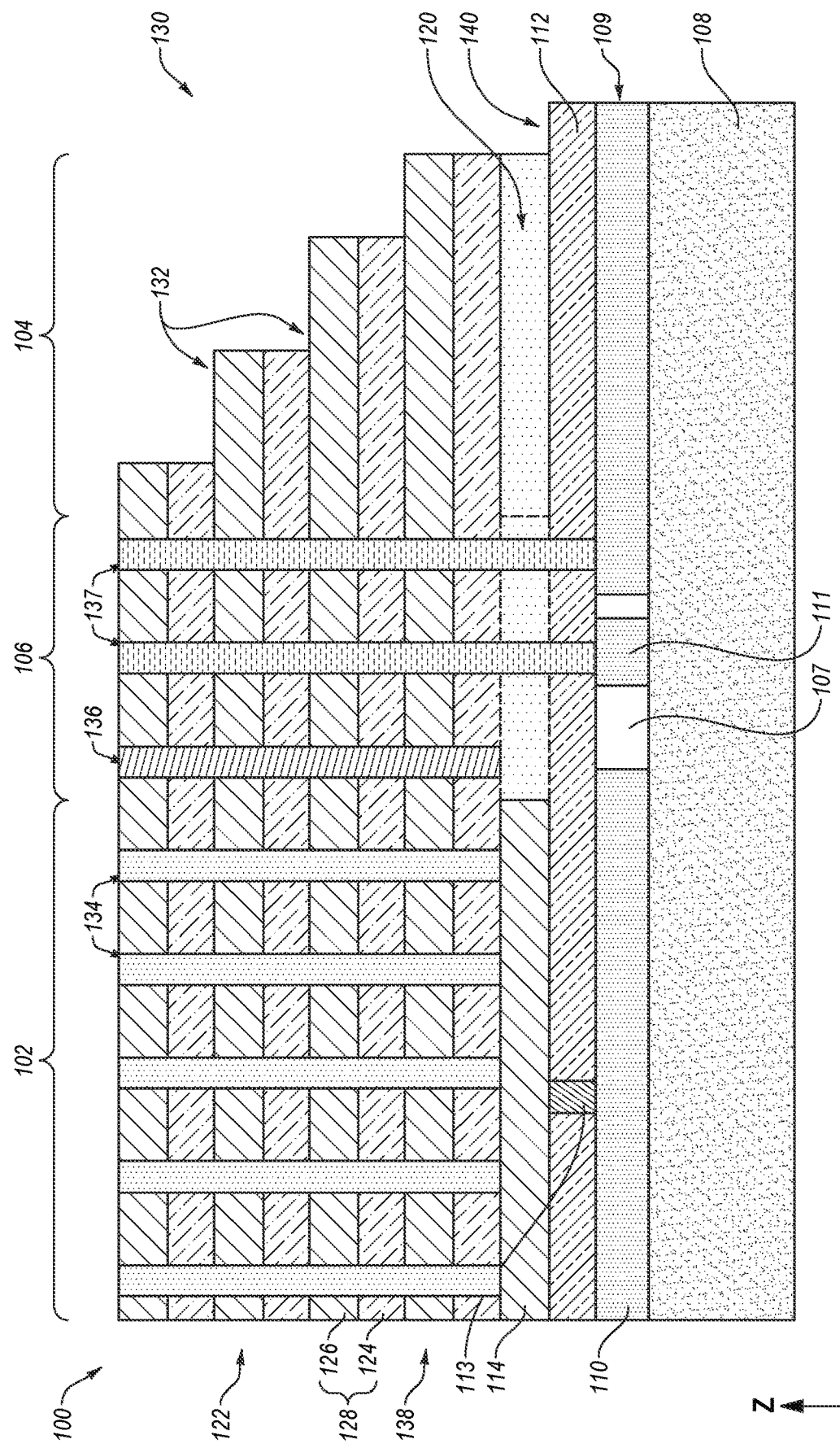
Figure 4B:
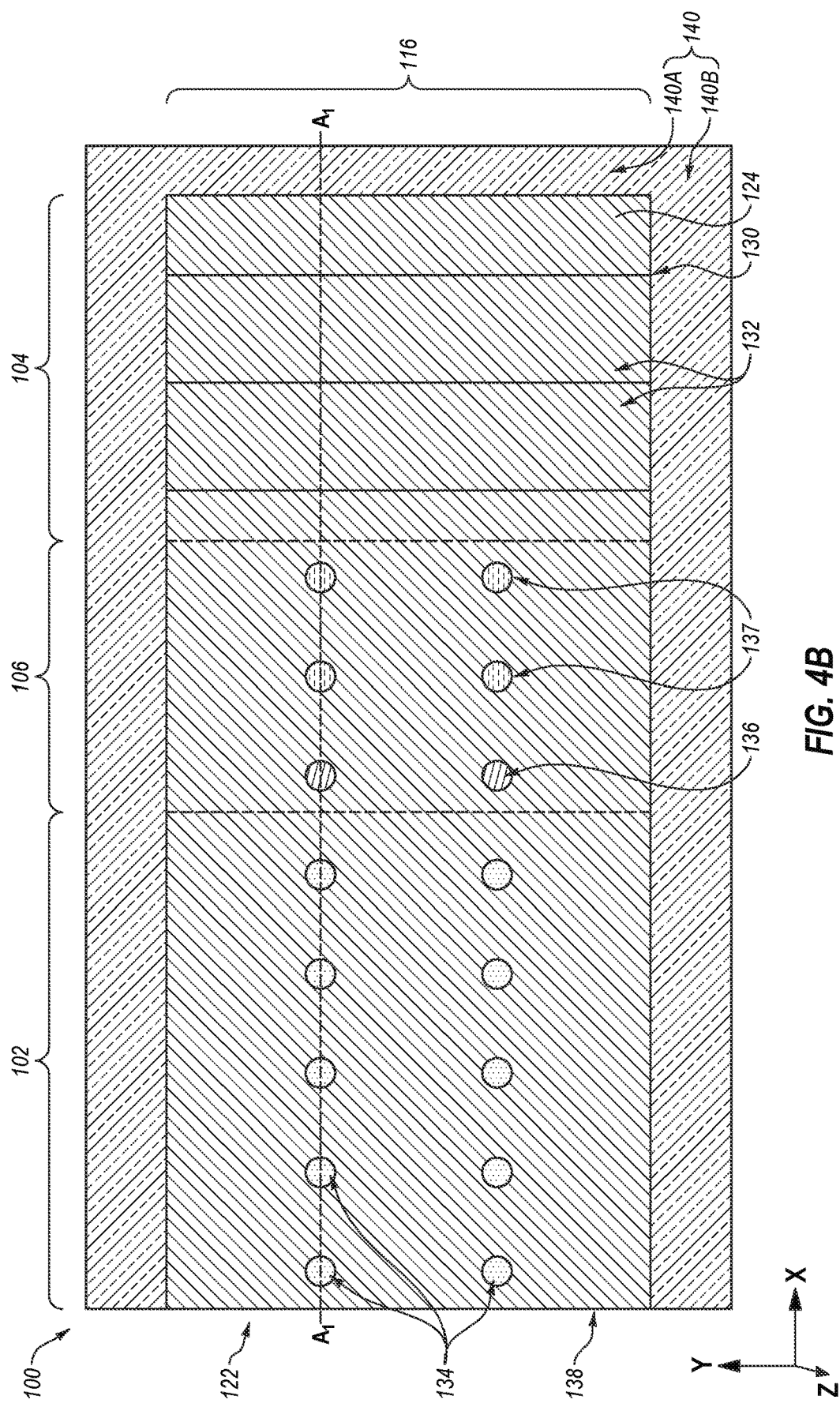

Next, referring collectively to FIG. 4A and FIG. 4B (which depicts a simplified partial top-down view of the microelectronic device structure 100 at the processing stage shown in FIG. 4A), portions of at least the preliminary stack structure 122 and the sacrificial material 114 within horizontal boundaries (e.g., in the Y-direction and the in the X-direction) of the slot regions 118 (FIG. 3B) (as well as portions of the etch-resistant material 120 within the horizontal boundaries of the slot regions 118, if any) of the microelectronic device structure 100 may be removed to form slots 140 (e.g., slits, openings, trenches). The slots 140 may divide (e.g., partition) the preliminary stack structure 122 into preliminary blocks 138 horizontally separated from one another by the slots 140. In addition, the slots 140 may also divide the sacrificial material 114 into multiple segments individually confined within horizontal boundaries of individual preliminary blocks 138 vertically thereover and horizontally separated from one another by the slots 140. The view depicted in FIG. 4A is a simplified partial cross-sectional view of the microelectronic device structure 100 about the dashed line $A_1$-$A_1$ illustrated in FIG. 4B.

As shown in FIG. 4B, the slots 140 may be formed to include first slots 140A horizontally extending in a first horizontal direction (e.g., the X-direction), and second slots 140B horizontally extending in a second horizontal direction (e.g., the Y-direction) orthogonal to the first horizontal direction. The first slots 140A may be horizontally interposed between preliminary blocks 138 (and, hence, segments of the sacrificial material 114) horizontally neighboring one another in the second horizontal direction; and the second slots 140B may be horizontally interposed between preliminary blocks 138 (and, hence, segments of the sacrificial material 114) horizontally neighboring one another in the first horizontal direction. The first slots 140A may horizontally intersect the second slots 140B, and may be integral and continuous with the second slots 140B. The slots 140, including the first slots 140A and the second slots 140B thereof, may subsequently be filled with insulative material after subjecting the microelectronic device structure 100 to so called "replacement gate" or "gate last" processing, as described in further detail below.

Figure 5B:
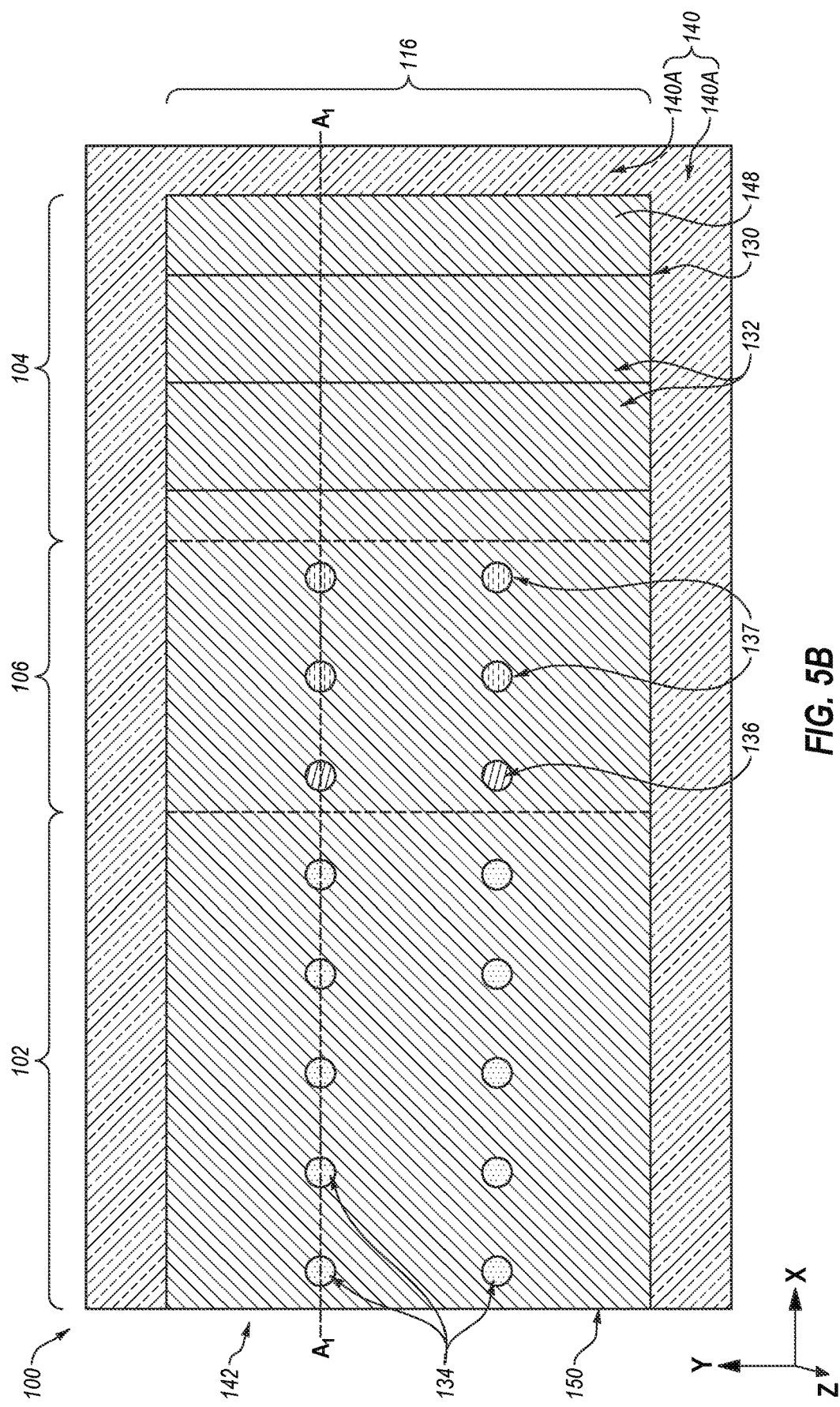

Next, referring to FIG. 5A and FIG. 5B (which depicts a simplified partial top-down view of the microelectronic device structure 100 at the processing stage shown in FIG. 5A) the microelectronic device structure 100 may be subjected to so called "replacement gate" or "gate last" processing. The replacement gate processing may at least partially replace remaining portions of the additional sacrificial material 126 (FIG. 4A) and the sacrificial material 114 (FIG. 4A) with conductive material to form conductive structures 148 and lateral contact structures 152, respectively. The replacement gate processing may convert the preliminary stack structure 122 (FIG. 4A and FIG. 4B) including the preliminary blocks 138 (FIG. 4A and FIG. 4B) into a stack structure 142 including blocks 150. The stack structure 142 may include a vertically alternating (e.g., in the Z-direction) sequence of insulative structures 146 and the conductive structures 148 arranged in tiers 144. The insulative structures 146 may correspond to remaining (e.g., unremoved) portions of the insulative material 124 (FIG. 4A) following the replacement gate processing. The stack structure 142 may be divided into the blocks 150, and the shapes and dimensions of the blocks 150 may be substantially the same as the shapes and dimensions of the preliminary blocks 138 (FIG. 4A and FIG. 4B) of the preliminary stack structure 122 (FIG. 4A and FIG. 4B). The slots 140 may be interposed between horizontally neighboring blocks 150 of the stack structure 142. The view depicted in FIG. 5A is a simplified partial cross-sectional view of the microelectronic device structure 100 about the dashed line $A_1$-$A_1$ illustrated in FIG. 5B.

The conductive structures 148 of the stack structure 142 may be employed as access line structures (e.g., local access line structures, local word line structures). In some embodiments, the conductive structures 148 are formed of and include W. Optionally, at least one liner material (e.g., at least one insulative liner material, at least one conductive liner materials) may be formed around the conductive structures 148. The liner material may, for example, be formed of and include one or more of a metal (e.g., titanium, tantalum), an alloy, a metal nitride (e.g., tungsten nitride, titanium nitride, tantalum nitride), and a metal oxide (e.g., aluminum oxide). In some embodiments, the liner material comprises at least one conductive material employed as a seed material for the formation of the conductive structures 148. In some embodiments, the liner material comprises titanium nitride ($TiN_x$, such as TiN). In further embodiments, the liner material further includes aluminum oxide ($AlO_x$, such as $Al_2O_3$). As a non-limiting example, $AlO_x$ (e.g., $Al_2O_3$) may be formed directly adjacent the insulative structures 146, $TiN_x$ (e.g., TiN) may be formed directly adjacent the $AlO_x$ and W may be formed directly adjacent the $TiN_x$. For clarity and ease of understanding the description, the liner material is not illustrated in FIG. 5A and FIG. 5B, but it will be understood that the liner material may be disposed around the conductive structures 148.

At least one lower conductive structure 148 of an individual block 150 of the stack structure 142 may be employed as at least one lower select gate (e.g., at least one source side select gate (SGS)) for lower select transistors (e.g., source side select transistors) of the block 150. In some embodiments, a single (e.g., only one) conductive structure 148 of a vertically lowermost tier 144 of a block 150 of the stack structure 142 is employed as a lower select gate (e.g., an SGS) for the block 150. In addition, upper conductive structure 148 of an individual block 150 of the stack structure 142 may be employed as upper select gate(s) (e.g., drain side select gate(s) (SGDs)) for upper select transistors (e.g., drain side select transistors) of the block 150. In some embodiments, horizontally neighboring (e.g., in the Y-direction) conductive structures 148 of a vertically uppermost tier 144 of a block 150 are employed as upper select gates (e.g., SGDs) for the block 150. The horizontally neighboring conductive structures of the vertically uppermost tier 144 of the block 150 may be separated from one another by an additional slot (e.g., an SGD slot) may be subsequently be filled with insulative material.

Intersections of the cell pillar structures 134 and the conductive structures 148 of the stack structure 142 may define vertically extending strings of memory cells 154 coupled in series with one another within the stack structure 142. In some embodiments, the memory cells 154 formed at the intersections of the conductive structures 148 and the cell pillar structures 134 within different tiers 144 of the stack structure 142 comprise so-called "MONOS" (metal-oxide-nitride-oxide-semiconductor) memory cells. In additional embodiments, the memory cells 154 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 154 comprise so-called "floating gate" memory cells including floating gates (e.g., metallic floating gates) as charge storage structures. The floating gates may horizontally intervene between central structures of the cell pillar structures 134 and the conductive structures 148 of the different tiers 144 of the stack structure 142.

The lateral contact structures 152 may be employed to electrically connect the cell pillar structures 134 (and, hence, the vertically extending strings of memory cells 154) vertically extending through the blocks 150 of the stack structure 142 to the source structure 110 of the source tier 109. Individual lateral contact structures 152 may extend between and contact (e.g., physically contact, electrically contact) the channel material (e.g., polysilicon) of multiple cell pillar structures 134 within individual block 150 of the stack structure 142, and may also contact (e.g., physically contact, electrically contact) at least some of the vertical contact structures 113 coupled to the source structure 110 within the source tier 109 of the microelectronic device structure 100. Within horizontal boundaries of an individual block 150, individual lateral contact structures 152 may be located horizontally adjacent (e.g., in the X-direction) the etch-resistant material 120 within the horizontal boundaries of the individual block 150.

The lateral contact structures 152 may at least be formed and positioned within horizontal boundaries (e.g., in the X-direction) of the memory array region 102 of the microelectronic device structure 100. In some embodiments, the lateral contact structures 152 are substantially confined within the horizontal boundaries of the memory array region 102 of the microelectronic device structure 100. In additional embodiments, depending on the horizontal geometric configurations of the remaining portions of the sacrificial material 114 (FIG. 4A) and the etch-resistant material 120, the lateral contact structures 152 are formed to extend beyond the horizontal boundaries of the memory array region 102 of the microelectronic device structure 100. For example, if the remaining portions of the sacrificial material 114 (FIG. 4A) horizontally extend into the intervening region 106 of the microelectronic device structure 100, the lateral contact structures 152 may also horizontally extend into the intervening region 106 of the microelectronic device structure 100. The lateral contact structures 152 may not substantially horizontally extend into the staircase region 104 of the microelectronic device structure 100. The staircase region 104 of the microelectronic device structure 100 may be substantially free of the lateral contact structures 152. As shown in FIG. 5A, the etch-resistant material 120 may remain within the staircase region 104 of the microelectronic device structure 100 following the replacement gate processing of the microelectronic device structure 100.

A material composition of the lateral contact structures 152 may be substantially the same as a material composition of the conductive structures 148 of the stack structure 142, or the material composition of the lateral contact structures 152 may be different than the material composition of the conductive structures 148 of the stack structure 142. In some embodiments, the lateral contact structures 152 are formed of and include W. The lateral contact structures 152 may individually be substantially homogeneous, or the lateral contact structures 152 may individually be heterogeneous.

The replacement gate processing employed to form the stack structure 142 and the lateral contact structures 152 may include treating the microelectronic device structure 100 with at least one wet etchant formulated to selectively remove portions of the sacrificial material 114 (FIG. 4A) and the additional sacrificial material 126 (FIG. 4A) exposed by the slots 140 without substantially removing portions of the isolation material 112, the etch-resistant material 120, and the insulative material 124 (FIG. 4A) exposed by the slots 140 to form recesses. By way of non-limiting example, depending on material compositions of the sacrificial material 114 (FIG. 4A), the additional sacrificial material 126 (FIG. 4A), the isolation material 112, the etch-resistant material 120, and the insulative material 124 (FIG. 4A), the wet etchant may one or more of TMAH, $H_3PO_4$, sulfuric acid ($H_2SO_4$), hydrochloric acid (HCl), nitric acid ($HNO_3$), and another material. In some embodiments wherein the sacrificial material 114 (FIG. 4A) and the additional sacrificial material 126 (FIG. 4A) comprise polysilicon, the sacrificial material 114 (FIG. 4A) and the additional sacrificial material 126 (FIG. 4A) are at least partially removed without substantially removing the isolation material 112, the etch-resistant material 120, and the insulative material 124 (FIG. 4A) using a wet etchant comprising TMAH. In additional embodiments wherein the sacrificial material 114 (FIG. 4A) and the additional sacrificial material 126 (FIG. 4A) comprise a dielectric nitride material (e.g., $SiN_y$, such as $Si_3N_4$), the sacrificial material 114 (FIG. 4A) and the additional sacrificial material 126 (FIG. 4A) are at least partially removed without substantially removing the isolation material 112, the etch-resistant material 120, and the insulative material 124 (FIG. 4A) using a wet etchant comprising $H_3PO_4$. Following the selective removal of the portions of the sacrificial material 114 (FIG. 4A) and the additional sacrificial material 126 (FIG. 4A), the resulting recesses may be filled with conductive material to form the lateral contact structures 152 and the conductive structures 148, respectively.

During the replacement gate processing, the etch-resistant material 120 within at least the staircase region 104 of the microelectronic device structure 100 may impede or prevent undesirable damage (e.g., tier collapse, tier cracking, tier lifting) and/or undesirable deformations (e.g., tier bending, tier warping, tier bowing) to the preliminary stack structure 122 (FIG. 4A) within the staircase region 104 of the microelectronic device structure 100 that may otherwise occur if portions of the sacrificial material 114 (FIG. 4A) were not replaced with the etch-resistant material 120 during the processing stage previously described with respect to FIG. 2A and FIG. 2B. For example, forming the etch-resistant material 120 within the staircase region 104 of the microelectronic device structure 100 circumvents removal of sacrificial material 114 (FIG. 4A) within the staircase region 104 that may otherwise occur during the replacement gate processing and that may impart stresses effectuating undesirable damage to and/or undesirable deformations of portions of the tiers 128 (FIG. 4A) of the preliminary stack structure 122 (FIG. 4A) within the staircase region 104 ahead of the formation of the conductive structures 148.

Thus, in accordance with embodiments of the disclosure, a method of forming a microelectronic device comprises forming a sacrificial material over a base structure. Portions of the sacrificial material are replaced with an etch-resistant material. A stack structure is formed over the etch-resistant material and remaining portions of the sacrificial material. The stack structure comprises a vertically alternating sequence of insulative material and additional sacrificial material arranged in tiers, and at least one staircase structure horizontally overlapping the etch-resistant material and having steps comprising horizontal ends of the tiers. Slots are formed to vertically extend through the stack structure and the remaining portions of the sacrificial material. The sacrificial material and the additional sacrificial material are selectively replaced with conductive material after forming the slots to respectively form lateral contact structures and conductive structures.

Figure 6:
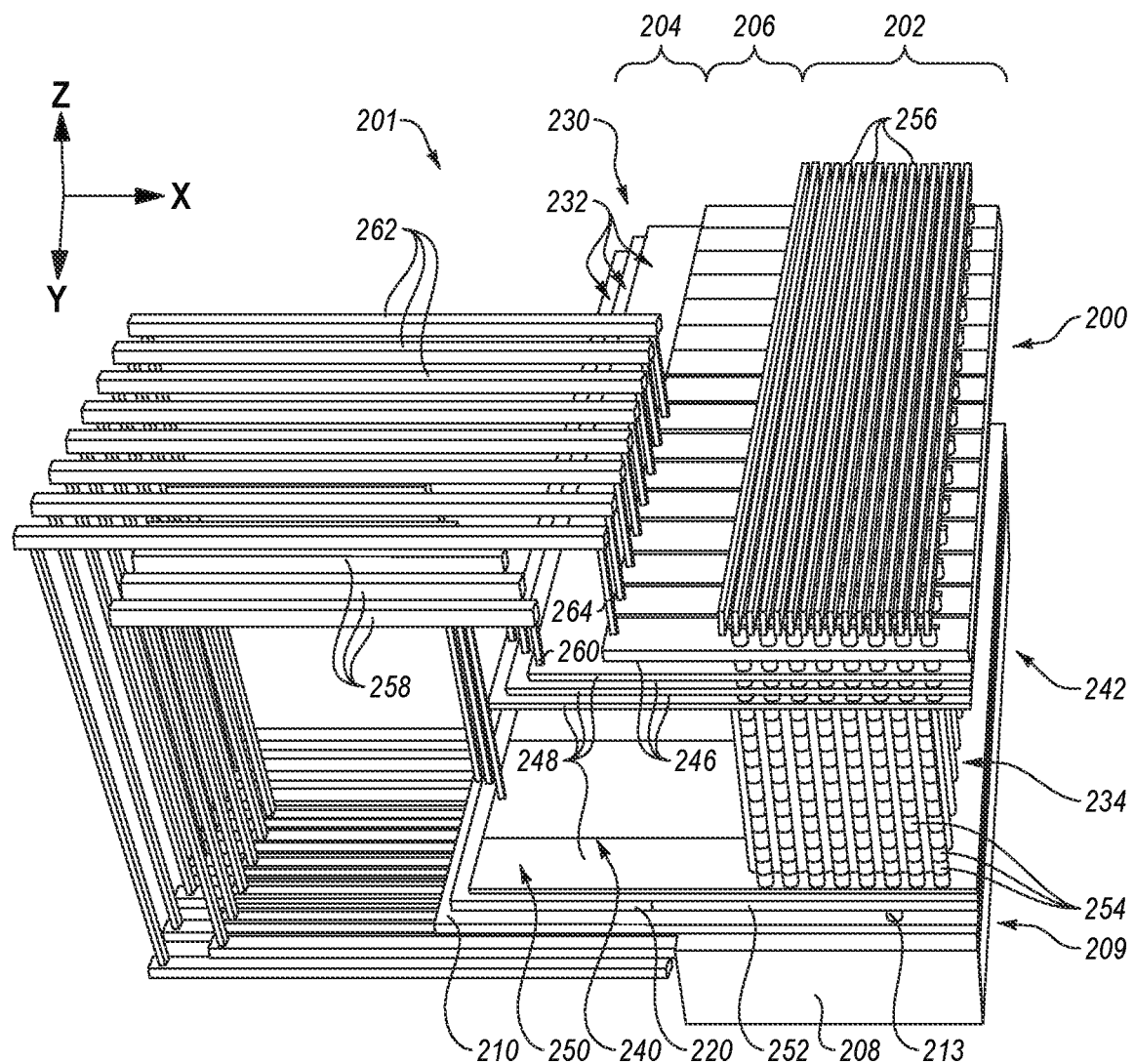
FIG. 6 is a simplified partial cutaway perspective view of a microelectronic device, in accordance with embodiments of the disclosure.

FIG. 6 illustrates a partial cutaway perspective view of a portion of a microelectronic device 201 (e.g., a memory device, such as a 3D NAND Flash memory device) including a microelectronic device structure 200. The microelectronic device structure 200 may be substantially similar to the microelectronic device structure 100 following the processing stage previously described with reference to FIG. 5A and FIG. 5B. In some embodiments, the microelectronic device structure 200 is formed through the processes previously described with reference to FIG. 1A through FIG. 5B. To avoid repetition, not all features (e.g., structures, materials, regions, devices) shown in FIG. 6 are described in detail herein. Rather, unless described otherwise below, in FIG. 6, a feature designated by a reference numeral that is a 100 increment of the reference numeral of a feature previously described with reference to one or more of FIG. 1A through FIG. 5B will be understood to be substantially similar to the previously described feature. In addition, for clarity and ease of understanding the drawings and associated description, some features of the microelectronic device structure 100 following the processing stage previously described with reference to FIG. 5A and FIG. 5B are not shown in FIG. 6. However, it will be understood that any features of the microelectronic device structure 100 following the processing stage previously described with reference to FIG. 5A and FIG. 5B may be included in the microelectronic device structure 200 of the microelectronic device 201 described herein with reference to FIG. 6.

As shown in FIG. 6, in addition to the features of the microelectronic device structure 200 previously described herein in relation to the microelectronic device structure 100, the microelectronic device 201 may further include digit lines 256 (e.g., data lines, bit lines), access line routing structures 258, access line contact structures 260, select line routing structures 262, and select line contact structures 264. The access line contact structures 260 and the select line contact structures 264 may contact (e.g., physically contact, electrically contact) steps 232 of staircase structures 230 within the staircase region 204 of the microelectronic device 201, and may couple components to one another as shown (e.g., the select line routing structures 262 to conductive structures 248 of the stack structure 242 employed as upper select gates (e.g., SGDs); the access line routing structures 258 to conductive structures 248 of the stack structure 242 employed as local access lines). In addition, as shown in FIG. 6, at least a portion of the base structure 208 is positioned within horizontal boundaries of the memory array region 202 of the microelectronic device 201. The base structure 208 may include a control logic region including control logic circuitry (e.g., CMOS circuitry) that may be coupled to the digit lines 256, the source structure 210 within the source tier 209, the access line routing structures 258, and the select line routing structures 262. In such embodiments, the control logic region of the base structure 208 may be characterized as having a "CMOS under Array" ("CuA") configuration.

Thus, in accordance with embodiments of the disclosure, a microelectronic device comprises blocks, an etch-resistant material, lateral contact structures, and additional conductive structures. The blocks each have a vertically alternating sequence of conductive structures and insulative structures arranged in tiers. Each of the blocks comprises a staircase structure having steps comprising horizontal ends of the tiers. The etch-resistant material vertically underlies each of the blocks and is within horizontal boundaries of the staircase structure of each of the blocks. The lateral contact structures vertically underlie each of the blocks and are outside of horizontal boundaries of the staircase structure. The lateral contact structures horizontally neighbor and are at substantially the same vertical position as the etch-resistant material. The additional conductive structures vertically underlie and are electrically connected to the lateral contact structures.

Furthermore, in accordance with embodiments of the disclosure, a memory device comprises a stack structure, a staircase structure, an etch-resistant material, additional conductive structures, vertically extending strings of memory cells, and a base structure. The stack structure comprises blocks each having tiers comprising a conductive structure and an insulative structure vertically neighboring the conductive structure. The staircase structure is within a contact region of each block of the stack structure, and has steps comprising edges of the tiers of the block. The etch-resistant material vertically underlies the stack structure and is within horizontal boundaries of the contact region of each block of the stack structure. The additional conductive structures vertically underlie the stack structure and are within horizontal boundaries of a memory array region of each block of the stack structure. The additional conductive structures horizontally neighbor and are at substantially the same vertical position as the etch-resistant material. The vertically extending strings of memory cells are within the memory array region of each block of the stack structure and are coupled to the additional conductive structures. The base structure vertically underlies the stack structure and comprises control logic circuitry coupled to the vertically extending strings of memory cells.

Figure 7:
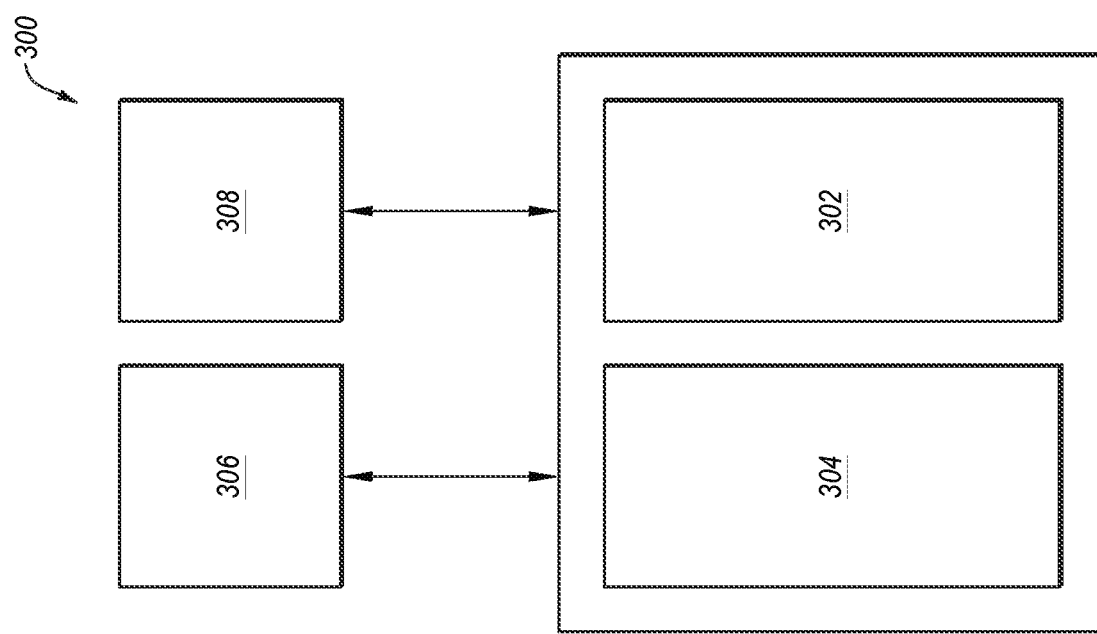
FIG. 7 is a schematic block diagram of an electronic system, in accordance with an embodiment of the disclosure.

Microelectronic devices structures (e.g., the microelectronic device structure 100 (FIGS. 5A and 5B)) and microelectronic devices (e.g., the microelectronic device 201 (FIG. 6)) in accordance with embodiments of the disclosure may be used in embodiments of electronic systems of the disclosure. For example, FIG. 7 is a block diagram of an illustrative electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The electronic system 300 includes at least one memory device 302. The memory device 302 may comprise, for example, one or more of a microelectronic device structure (e.g., the microelectronic device structure 100 (FIGS. 5A and 5B)) and a microelectronic device (e.g., the microelectronic device 201 (FIG. 6)) previously described herein. The electronic system 300 may further include at least one electronic signal processor device 304 (often referred to as a "microprocessor"). The electronic signal processor device 304 may, optionally, include one or more of a microelectronic device structure (e.g., the microelectronic device structure 100 (FIGS. 5A and 5B)) and a microelectronic device (e.g., the microelectronic device 201 (FIG. 6)) previously described herein. While the memory device 302 and the electronic signal processor device 304 are depicted as two (2) separate devices in FIG. 7, in additional embodiments, a single (e.g., only one) memory/processor device having the functionalities of the memory device 302 and the electronic signal processor device 304 is included in the electronic system 300. In such embodiments, the memory/processor device may include one or more of a microelectronic device structure (e.g., the microelectronic device structure 100 (FIGS. 5A and 5B)) and a microelectronic device (e.g., the microelectronic device 201 (FIG. 6)) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 may comprise a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosures, an electronic system comprises an input device, an output device, a processor device operably connected to the input device and the output device, and a memory device operably connected to the processor device. The memory device comprises blocks, strings of memory cells, digit line structures, an etch-resistant material, lateral contact structures, at least one source structure, and a base structure. The blocks each have a vertically alternating sequence of conductive structures and insulative structures arranged in tiers. Each of the blocks comprises a staircase structure having steps comprising horizontal ends of the tiers of the block. The strings of memory cells vertically extend through the blocks. The digit line structures vertically overlie the blocks and are coupled to the strings of memory cells. The etch-resistant material vertically underlies each of the blocks and is within horizontal boundaries of the staircase structure of each of the blocks. The lateral contact structures vertically underlie each of the blocks and are outside of the horizontal boundaries of the staircase structure of each of the blocks. The lateral contact structures are each coupled to some of the strings of memory cells and are each directly horizontally adjacent to some of the etch-resistant material. The at least one source structure vertically underlies and is coupled to the lateral contact structures. The base structure vertically underlies the at least one source structure and comprising control logic devices coupled to the conductive structures of the blocks, the digit line structures, and the at least one source structure.

The methods, structures (e.g., the microelectronic device structure 100 (FIGS. 5A and 5B)), devices (e.g., the microelectronic device 201 (FIG. 6)), and systems (e.g., the electronic system 300 (FIG. 7)) of the disclosure advantageously facilitate one or more of improved performance, reliability, and durability, lower costs, increased miniaturization of components, improved pattern quality, and greater packaging density as compared to conventional structures, conventional devices, and conventional systems. By way of non-limiting example, the methods and structures of the disclosure may reduce the risk of undesirable deformations (e.g., tier bending, tier warping, tier bowing) and damage (e.g., tier collapse) during the formation of devices (e.g., the microelectronic device 201) of the disclosure, and may effectuate increased yield and decreased current leakage (e.g., which may otherwise result from the undesirable deformations and/or damage) as compared to conventional methods, conventional structures, and conventional devices.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment of the disclosure may be combined with elements and features disclosed in relation to other embodiments of the disclosure.

What is claimed is:

1. A method of forming a microelectronic device, comprising:
    forming a sacrificial material over a base structure;
    replacing portions of the sacrificial material with an etch-resistant material;
    forming a stack structure over the etch-resistant material and remaining portions of the sacrificial material, the stack structure comprising:
        a vertically alternating sequence of insulative material and additional sacrificial material arranged in tiers; and
        at least one staircase structure horizontally overlapping the etch-resistant material and having steps comprising horizontal ends of the tiers;
    forming slots vertically extending through the stack structure and the remaining portions of the sacrificial material; and
    selectively replacing the sacrificial material and the additional sacrificial material with conductive material after forming the slots to respectively form lateral contact structures and conductive structures.

2. The method of claim 1, wherein replacing portions of the sacrificial material with an etch-resistant material comprises:
    removing the portions of the sacrificial material to form openings vertically extending through the remaining portions of the sacrificial material; and
    filling the openings with the etch-resistant material.

3. The method of claim 2, further comprising selecting the etch-resistant material to comprise at least one material having relatively greater etch resistance than the sacrificial material during mutual exposure to at least one etchant.

4. The method of claim 2, further comprising:
    selecting the sacrificial material to comprise one of polysilicon and a dielectric nitride material; and
    selecting the etch-resistant material to comprise a dielectric oxide material.

5. The method of claim 1, wherein replacing portions of the sacrificial material with an etch-resistant material comprises doping the sacrificial material with at least one chemical species to form the etch-resistant material, the etch-resistant material having relatively greater etch resistance than the sacrificial material during mutual exposure to at least one etchant.

6. The method of claim 5, further comprising:
selecting the sacrificial material to comprise polysilicon; and
selecting the at least one chemical species to comprise one or more of boron, aluminum, gallium, carbon, nitrogen, and oxygen.

7. The method of claim 5, further comprising:
selecting the sacrificial material to comprise a dielectric nitride material; and
selecting the at least one chemical species to comprise one or more of carbon and oxygen.

8. The method of claim 1, wherein replacing portions of the sacrificial material with an etch-resistant material comprises replacing first portions of the sacrificial material to be located within horizontal boundaries of the at least one staircase structure with the etch-resistant material while maintaining second portions of the sacrificial material to be located within horizontal boundaries of an array of vertically extending strings of memory cells to be formed within the stack structure.

9. The method of claim 1, wherein forming a sacrificial material over a base structure comprises:
forming a source tier comprising at least one conductive source structure over the base structure;
forming an isolation material over the source tier;
forming conductive contact structures vertically extending through the isolation material and to the at least one conductive source structure within the source tier; and
forming the sacrificial material over the isolation material and the conductive contact structures.

10. The method of claim 1, further comprising forming cell pillar structures vertically extending through the stack structure, the cell pillar structures located outside of horizontal boundaries of the etch-resistant material.

11. The method of claim 10, further comprising forming additional pillar structures horizontally interposed between the cell pillar structures and the at least one staircase structure, at least some of the additional pillar structures located within horizontal boundaries of the etch-resistant material.

12. The method of claim 11, wherein forming the additional pillar structures comprises forming dummy pillar structures vertically extending to, into, or beyond the etch-resistant material.

13. The method of claim 11, wherein forming the additional pillar structures comprises forming conductive contact structures vertically extending to one or more additional conductive structures vertically interposed between the sacrificial material and the base structure.

14. The method of claim 1, wherein selectively replacing the sacrificial material and the additional sacrificial material with conductive material comprises at least partially replacing the sacrificial material and the additional sacrificial material with the conductive material without substantially replacing the etch-resistant material and the insulative material with the conductive material.

15. A method of forming a microelectronic device, comprising:
forming a microelectronic device structure comprising a base structure and sacrificial material over the base structure, the microelectronic device structure divided into at least:
an array region and a contact region in a first horizontal direction; and
block regions and slot regions in a second horizontal direction orthogonal to the first horizontal direction;
forming an etch-resistant material from sections of the sacrificial material within horizontal areas of portions of the contact region horizontally overlapping the block regions;
forming a preliminary stack structure over the etch-resistant material and remaining sections of the sacrificial material, the preliminary stack structure comprising:
tiers respectively comprising additional sacrificial material and insulative material vertically neighboring the additional sacrificial material; and
staircase structures within the horizontal areas of the portions of the contact region horizontally overlapping the block regions;
removing portions of the preliminary stack structure and the remaining sections of the sacrificial material within horizontal areas of the slot regions to form slots within the horizontal areas of the slot regions and preliminary blocks within horizontal areas of the block regions; and
after forming the slots and the preliminary blocks, selectively replacing remainders of the sacrificial material and the additional sacrificial material with conductive material.

16. The method of claim 15, wherein forming a microelectronic device structure comprises forming the microelectronic device structure to further comprise:
a source tier vertically interposed between the base structure and the sacrificial material, the source tier comprising:
a conductive source structure within a horizontal area of the array region, the conductive source structure in electrical communication with control logic devices within the base structure; and
conductive structures electrically isolated from the conductive source structure, at least some of the conductive structures outside of the horizontal area of the array region;
isolation material vertically interposed the source tier and the sacrificial material; and
conductive contact structures vertically extending from the sacrificial material, through the isolation material, and to the conductive source structure of the source tier.

17. The method of claim 15, wherein:
forming an etch-resistant material from sections of the sacrificial material within horizontal areas of portions of the contact region horizontally overlapping the block regions comprises forming the etch-resistant material within the horizontal areas of the portions of the contact region without forming the etch-resistant material with horizontal areas of portions of the array region horizontally overlapping the block regions; and
selectively replacing remainders of the sacrificial material and the additional sacrificial material with conductive material comprises substantially replacing the remainders of the sacrificial material and the additional sacrificial material with the conductive material without substantially replacing remainders of the insulative material and the etch-resistant material with the conductive material.

18. The method of claim 15, further comprising, before forming the slots and the preliminary blocks:
forming cell pillar structures within horizontal areas of portions of the array region horizontally overlapping the block regions, the cell pillar structures comprising semiconductive material vertically extending through the preliminary stack structure and the remaining sections of the sacrificial material; and forming deep contact structures outside of the horizontal areas of the portions of the array region horizontally overlapping the block regions, the deep contact structures comprising conductive material vertically extending through the preliminary stack structure and the etch-resistant material.

19. A method of forming a microelectronic device, comprising:
forming a microelectronic device structure comprising:
a base structure comprising CMOS circuitry; and
sacrificial material overlying the base structure;
replacing portions of the sacrificial material with etch-resistant material;
forming a preliminary stack structure over the etch-resistant material and remaining portions of the sacrificial material, the preliminary stack structure comprising:
tiers individually comprising insulative material and additional sacrificial material vertically adjacent the insulative material; and
staircase structures having steps defined by horizontal ends of the tiers, the staircase structures individually horizontally overlapping the etch-resistant material;
forming pillar structures within portions of the preliminary stack structure horizontally offset from the staircase structures, the pillar structures comprising semiconductive material vertically extending through the preliminary stack structure and the remaining portions of the sacrificial material;
forming slots vertically extending through the preliminary stack structure and the remaining portions of the sacrificial material; and
after forming the slots, selectively replacing remainders of the sacrificial material and the additional sacrificial material with conductive material.

20. The method of claim 19, wherein replacing portions of the sacrificial material with etch-resistant material comprises selecting the etch-resistant material to be relatively more resistant to removal than the sacrificial material during mutual exposure to an etchant.

* * * * *

UNITED STATES PATENT AND TRADEMARK OFFICE
CERTIFICATE OF CORRECTION

| | | |
|---|---|---|
| PATENT NO. | : 12,041,769 B2 | Page 1 of 1 |
| APPLICATION NO. | : 18/047245 | |
| DATED | : July 16, 2024 | |
| INVENTOR(S) | : John D. Hopkins, Jordan D. Greenlee and Nancy M. Lomeli | |

It is certified that error appears in the above-identified patent and that said Letters Patent is hereby corrected as shown below:

In the Specification

Column 4, Line 67, change "oxide ($TiO_x$)), a zirconium" to --oxide ($TiO_x$), a zirconium--

Column 18, Lines 38-39, change "the $AlO_x$ and W" to --the $AlO_x$, and W--

Signed and Sealed this
Tenth Day of September, 2024

Katherine Kelly Vidal
*Director of the United States Patent and Trademark Office*